United States Patent [19]

Nagano

[11] Patent Number: 4,489,244

[45] Date of Patent: Dec. 18, 1984

[54] CURRENT SOURCE CIRCUIT

[75] Inventor: Katsumi Nagano, Hiratsuka, Japan

[73] Assignee: Tokyo Shibaura Denki Kabushiki Kaisha, Kawasaki, Japan

[21] Appl. No.: 373,732

[22] Filed: Apr. 30, 1982

[30] Foreign Application Priority Data

May 8, 1981 [JP] Japan ................................ 56-69151

[51] Int. Cl.[3] .............................................. H03K 13/04

[52] U.S. Cl. ........................... 307/296 R; 307/299 R; 323/315; 340/347 CC

[58] Field of Search ................... 307/296 R, 299, 296; 340/347 CC, 347 AD; 323/312, 314, 315

[56] References Cited

U.S. PATENT DOCUMENTS 3,474,440 10/1969 Schmid .
3,890,611 6/1975 Pastoria .............................. 307/296
4,055,773 10/1977 Schoeff .......................... 307/296 R
4,176,344 11/1979 Saari et al. ................... 340/347 CC
4,349,811 8/1982 Brokaw ........................ 340/347 CC
4,408,190 10/1983 Nagano .............................. 323/315

FOREIGN PATENT DOCUMENTS 2157755 6/1972 Fed. Rep. of Germany .
5534537 8/1978 Japan .

*Primary Examiner*—Stanley D. Miller
*Assistant Examiner*—B. P. Davis
*Attorney, Agent, or Firm*—Finnegan, Henderson, Farabow, Garrett & Dunner

[57] ABSTRACT

A current source circuit has a current division circuit and a correction circuit. The current division circuit has a current source and a plurality of current shunting transistors series-connected between "+" potential and "−" potential. Each stage of current shunting transistors has at least one current output transistor. The emitters of the transistors of each stage are commonly connected, and bases thereof are also commonly connected. The bases of the transistors of each stage are supplied with predetermined voltages. The output currents are obtained from current output transistors of each stage. The correction circuit consists of a plurality of correction stages arranged in correspondence with the plurality of stages of the current division circuit.

14 Claims, 16 Drawing Figures

CURRENT SOURCE CIRCUIT

BACKGROUND OF THE INVENTION

The present invention relates to a current source circuit which is used for a digital-to-analog converter (to be referred to as a D/A converter hereinafter) and which produces a plurality of weighted current outputs.

As a current source circuit for producing a plurality of weighted current outputs, a current source circuit as shown in FIG. 1 is conventionally known. Referring to FIG. 1, npn transistors Q01, Q11, Q21 and Q31 are output transistors at the collectors of which are obtained weighted current outputs. NPN transistors Q02, Q12, Q22 and Q32 are shunting transistors through the collector-emitter paths of which flow currents which are equal to the currents flowing to the transistors Q01, Q11, Q21 and Q31. Reference symbol CS01 denotes a current source of a current I. Voltage inputs V1, V2, V3 and V4 are respectively supplied to current division stages each consisting of the transistors Q01 and Q02, the transistors Q11 and Q12, the transistors Q21 and Q22, and the transistors Q31 and Q32. Reference symbol "+" denotes the voltage potential of a first power source (not shown), while reference symbol "−" denotes the voltage potential of a second power source (not shown) which is lower than that of the first voltage source.

In the current source circuit as shown in FIG. 1, currents I1, I2, I3 and I4 which are respectively $\frac{1}{2}$, $\frac{1}{4}$, $\frac{1}{8}$ and 1/16 the current I flowing to the current source CS01 are obtained at the collectors of the output transistors Q01, Q11, Q21 and Q31. Since the current source circuit as shown in FIG. 1 is of the four-output configuration, it may be used as the current source for a D/A converter of 4-bit type. Due to its simple configuration, the current source circuit of this type makes the configuration of the D/A converter simpler as well.

However, with this current source circuit, when the currents flow to the collectors of the output transistors Q01 to Q31 (collectively referring to the transistors Q01, Q11, Q21 and Q31) and the shunting transistors Q02 to Q32 (collectively referring to the transistors Q02, Q12, Q22 and Q32), the output currents from the emitters thereof will include errors corresponding to the respective base currents. Thus, the currents I1, I2, I3 and I4 flowing to the respective transistor stages or the current division stages do not become exactly $\frac{1}{2}$, $\frac{1}{4}$, $\frac{1}{8}$ and 1/16 the current I. For this reason, with a D/A converter incorporating such a current source circuit, D/A conversion may not be expected to be at high accuracy.

The errors of the currents I1, I2, I3 and I4 will now be described.

Let $\alpha$ denote the common base current amplification factor of each of the transistors Q01 to Q31 and the transistors Q02 to Q32, and the output currents I1, I2, I3 and I4 are then given by the following relations:

$$I1=\alpha/2I \quad (1)$$

$$I2=\alpha^2/4I \quad (2)$$

$$I3=\alpha^3/8I \quad (3)$$

$$I4=\alpha^4/16I \quad (4)$$

The errors included in the output currents I1, I2, I3 and I4 will be obtained from the relations (1), (2), (3) and (4). Let $\beta$ denote the common emitter current amplification factor of each of the transistors Q01 to Q31 and the transistors Q02 to Q32, and then we obtain:

$$\alpha=\beta/(\beta+1) \quad (5)$$

Substitution of relation (5) in each of relations (1) to (4) provides:

$$I1=\frac{I}{2}\times\frac{\beta}{1+\beta}\simeq\frac{I}{2}\left(1-\frac{1}{\beta}\right) \quad (6)$$

$$I2=\frac{I}{4}\times\frac{\beta^2}{(1+\beta)^2}=\frac{I}{4}\left(\frac{1}{1+\frac{2\beta+1}{\beta^2}}\right)\simeq\frac{I}{4}\left(1-\frac{2}{\beta}\right) \quad (7)$$

$$I3=\frac{I}{8}\times\frac{\beta^2}{(1+\beta)^3}=\frac{I}{8}\left(\frac{1}{1+\frac{3\beta^2+3\beta+1}{\beta^3}}\right)\simeq\frac{I}{8}\left(1-\frac{3}{\beta}\right) \quad (8)$$

$$I4=\frac{I}{16}\times\frac{\beta^4}{(1+\beta)^4}=\frac{I}{16}\left(\frac{1}{1+\frac{4\beta^3+6\beta^2+4\beta+1}{\beta^4}}\right)\simeq\frac{I}{16}\left(1-\frac{4}{\beta}\right) \quad (9)$$

If $\beta=100$, the errors of the currents I1 to I4 are obtained as follows:

Error of the output current I1: −1%
Error of the output current I2: −2%
Error of the output current I3: −3%
Error of the output current I4: −4%

From these errors of the output currents obtained in this manner, it is seen that the errors increase as the number of current division stages increases, i.e., as the number of output currents increases. It follows from this that, with a D/A converter incorporating such a current source circuit, the accuracy of D/A conversion will be degraded as the number of bits of input data increases.

SUMMARY OF THE INVENTION

The present invention has been made in consideration of this and has for its object to provide a current source circuit which is capable of reducing the errors included in the output currents to the minimum and which is capable of producing a plurality of weighted current outputs.

The present invention provides a current source circuit comprising a current division circuit and a correction circuit. The current division circuit includes at least one current source and a plurality of current shunting transistors which are connected in series between a first voltage power source and a second voltage power source. Each stage of the plurality of current shunting transitors includes at least one output transistor for producing a current output. The emitters of the transistors in each stage are commonly connected, and the bases thereof are also commonly connected. A predetermined voltage is supplied to the bases of the transistors of each stage, and output currents are obtained from the collector of the output transistor in each stage.

The correction circuit consists of a plurality of correction stages which are formed in correspondence with the plurality of division stages. Each correction stage comprises two current sources, one terminal each of which is connected to the first voltage power source and which produces a current equal to a current output in the associated stage; output transistors, the emitter-collector paths of which are respectively connected between the current sources and the second voltage power source, and bases of which are respectively connected to the associated current division stage; and two correction transistors which are connected to the collectors of the respective current shunting transistors.

DETAILED DESCRIPTION OF THE PREFERRED EMBODIMENTS

Figure 1:
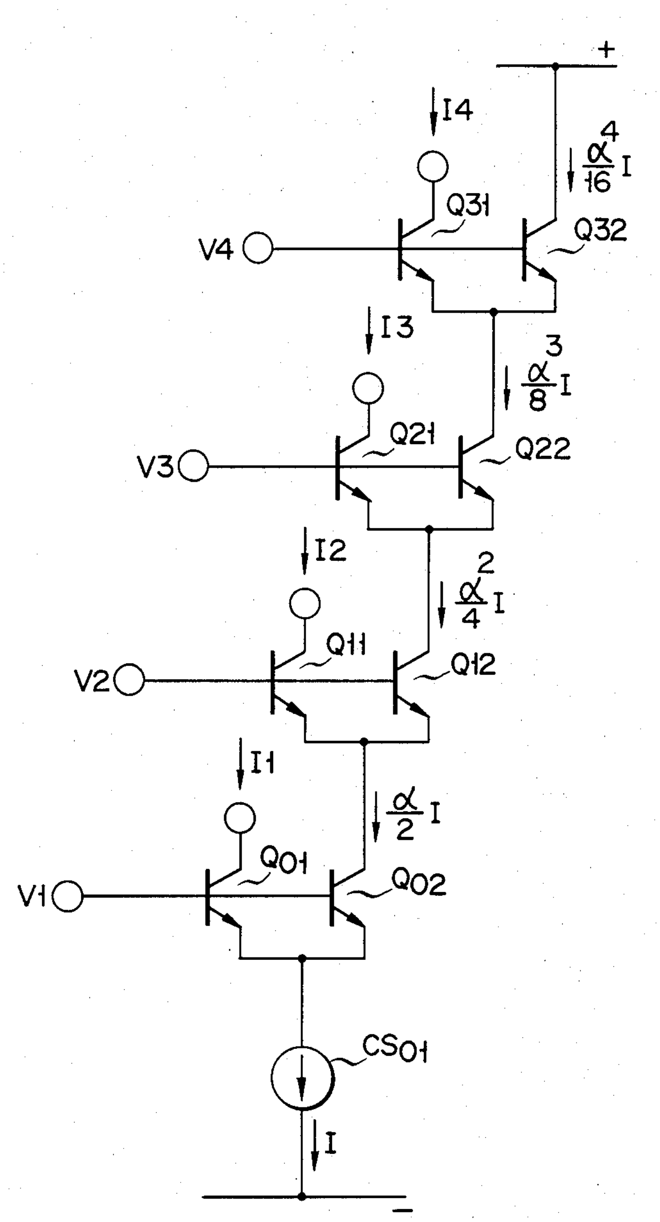
FIG. 1 is a circuit diagram of a conventional current source circuit.
Figure 2:
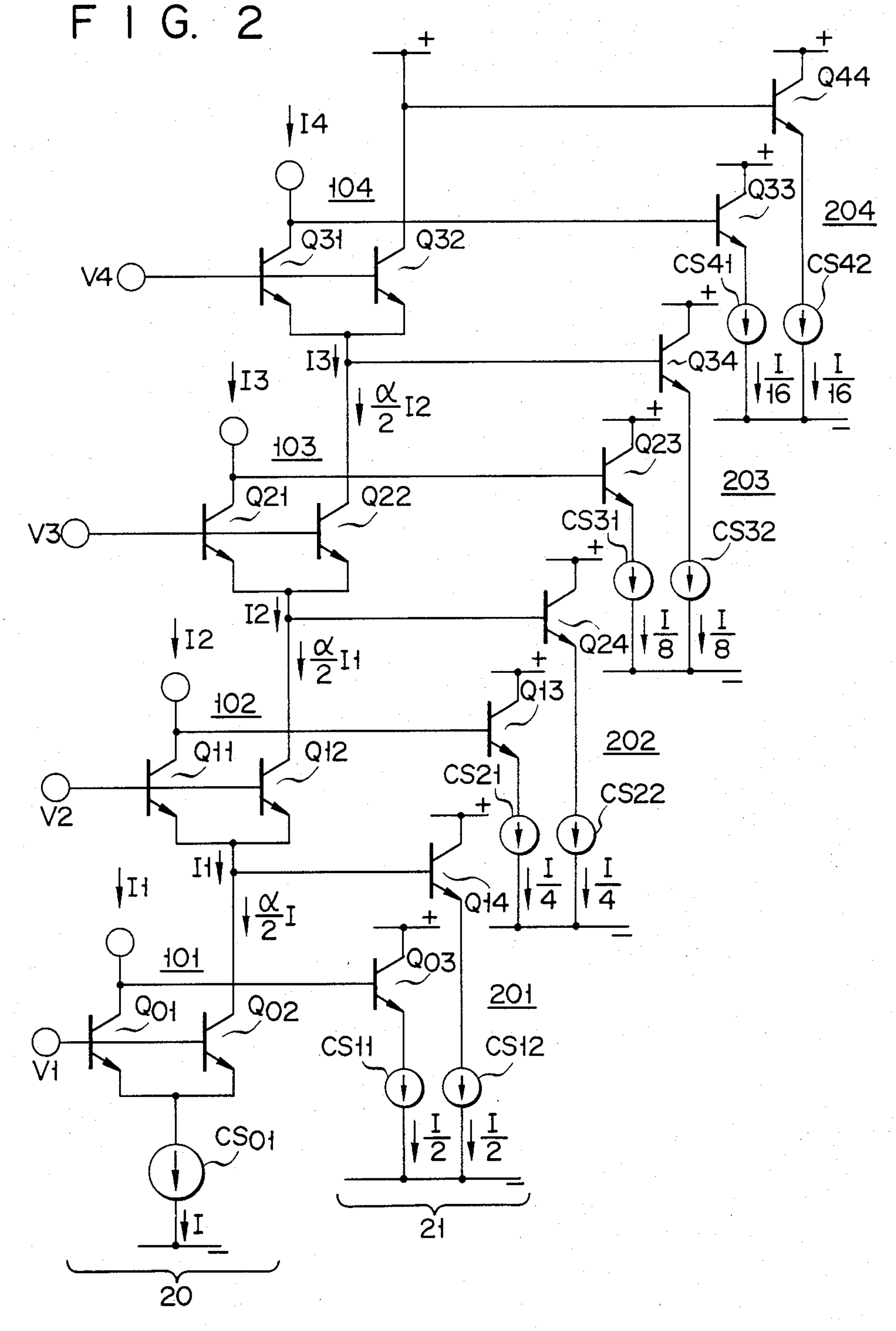
FIG. 2 is a circuit diagram of a current source circuit according to an embodiment of the present invention.

Referring to FIG. 2, the current source circuit has a current division circuit or current output circuit 20 for producing weighted output currents I1, I2, I3 and I4; and a correction circuit 21 for correcting the errors of the output currents I1, I2, I3 and I4 produced by the current division circuit 20. The current division circuit 20 is of the same configuration as that of the conventional circuit shown in FIG. 1. Thus, reference symbols Q01, Q11, Q21 and Q31 denote npn output transistors, while Q02, Q12, Q22 and Q32 denote npn shunting transistors. The output transistor Q01 constitutes together with the shunting transistor Q02 a first current division transistor stage or the first current output stage 101. The emitters of the output transistor Q01 and the shunting transistor Q02 are connected to a "−" potential of the first power source through the current source CS01 flowing an electric current I. The bases of the transistors Q01 and Q02 are commonly connected and are supplied with a first predetermined voltage input V1. The collector of the output transistor Q01 serves as the output terminal of the output current I1.

The output transistor Q11 and the shunting transistor Q12 constitute a second current division stage 102. The emitters of these transistors are both connected to the collector of the shunting transistor Q02. The bases of the output transistor Q11 and the shunting transistor Q12 are commonly connected and are supplied with a second predetermined voltage input V2 which is higher than V1. The collector of the output transistor Q11 serves as the output terminal of the output current I2.

The output transistor Q21 and the shunting transistor Q22 constitute a third current division stage 103. The emitters of these transistors are both connected to the collector of the shunting transistor Q12, while the bases thereof are commonly connected to each other and are supplied with a third predetermined voltage input V3 which is higher than V2. The collector of the output transistor Q21 serves as the output terminal of the output current I3.

The output transistor Q31 and the shunting transistor Q32 constitute a fourth current division stage 104. The emitters of these transistors are both connected to the collector of the shunting transistor Q22, while the bases thereof are commonly connected to each other and are supplied with a fourth predetermined voltage input V4 which is higher than V3. The collector of the output transistor Q31 serves as the output terminal of the output current I4. The collector of the shunting transistor Q32 is connected to a "+" potential of the second power source which is higher than the "−" potential of the first power source.

The correction circuit 21 includes correction stages respectively corresponding to the current division stages (current output stages). Each correction stage includes two current sources and two npn transistors. A correction stage 201 corresponding to the first current division stage 101 includes two current sources CS11 and CS12 one terminal of each of which is connected to the "−" potential; a correction transistor Q03, the emitter of which is connected to the other terminal of the current source CS11, the collector of which is connected to the "+" potential, and the base of which is connected to the collector of the output transistor Q01; and a correction transistor Q14, the emitter of which is connected to the other terminal of the current source CS12, the collector of which is connected to the "+" potential, and the base of which is connected to the collector of the shunting transistor Q02.

The current sources CS11 and CS12 flow electric current which is ½ the electric current I or I/2 flowing to the current source CS01 of the current division circuit 20. The correction transistor Q03 adds an electric current which is substantially the same as the base current of the output transistor Q01 to the current output from the output transistor Q01 of the associated, first current division stage 101. The correction transistor Q03 thus serves to correct the current output. Similarly, the correction transistor Q14 adds an electric current substantially the same as the base current of the shunting transistor Q02 to the shunt current output from the shunting transistor Q02 of the first current division stage 101. The correction transistor Q14 thus serves to correct the shunt current output. The bases of the correction transistors Q03 and Q14 are respectively connected to the collectors of the output transistor Q01 and the shunting transistor Q02.

In a similar manner, a correction stage 202 corresponding to the second current division stage 102 includes two current sources CS21 and CS22 corresponding terminals of which are connected to the "−" potential and which flow an electric current of I/4; a correction transistor Q13, the emitter of which is connected to the other terminal of the current source CS21 and the collector of which is connected to the "+" potential; and a correction transistor Q24, the emitter of which is connected to the other terminal of the current source CS22, the collector of which is connected to the "+" potential and the base of which is connected to the collector of the shunting transistor Q12. The bases of the correction transistors Q13 and Q24 are respectively connected to the collector of the output transistor Q11 and the collector of the shunting transistor Q12 of the second current division stage 102.

Similarly, a correction stage 203 corresponding to the third current division stage 103 includes two current sources CS31 and CS32, corresponding terminals of which are connected to the "−" potential and which flow an electric current of I/8; a correction transistor Q23, the collector of which is connected to the "+" potential and the emitter of which is connected to the other terminal of the current source CS31; and a correction transistor Q34, the collector of which is connected to the "+" potential and the emitter of which is connected to the other terminal of the current source CS32. The bases of the correction transistors Q23 and Q34 are respectively connected to the collector of the output transistor Q21 and the collector of the shunting transistor Q22 of the third current division stage 103.

A correction stage 204 corresponding to the fourth current division stage 104 includes two current sources CS41 and CS42, corresponding terminals of which are connected to the "−" potential and which flow a current of I/16; a correction transistor Q33, the collector of which is connected to the "+" potential and the emitter of which is connected to the other terminal of the current source CS41; and a correction transistor Q44, the collector of which is connected to the "+" potential and the emitter of which is connected to the other terminal of the current source CS42. The bases of the correction transistors Q33 and Q44 are respectively connected to the collector of the output transistor Q31 and the collector of the shunting transistor Q32 of the fourth current division stage 104.

When voltage inputs of predetermined potentials are supplied to the bases of the output transistors and the shunting transistors of each current division stage in a current source circuit of the configuration as described above, these transistors are turned on and electric currents flow to the division circuit 20 through the current division stages and the current source CS01. Part of the electric current flowing to the output transistor Q01 of the first current division stage 101 flows to the base of the correction transistor Q03 of the associated correction stage 201. Part of the electric current flowing to the shunting transistor Q02 flows to the base of the correction transistor Q14. Then, the correction transistors Q03 and Q14 are turned on. An electric current of I/2 flows through the correction transistor Q03 and the current source CS11, while an electric current of I/2 also flows through the correction transistor Q14 and the current source CS12.

Similarly, part of the electric current flowing to the output transistor Q11 of the second current division stage 102 flows to the base of the correction transistor Q13 of the associated correction stage 202. Part of the electric current flowing to the shunting transistor Q12 flows to the base of the correction transistor Q24. Then, the correction transistors Q13 and Q24 are turned on. An electric current of I/4 flows through the correction transistor Q13 and the current source CS21, while an electric current of I/4 also flows through the correction transistor Q24 and the current source CS22.

In a similar manner, part of the electric current flowing to the output transistor Q21 of the third current division stage 103 flows to the base of the correction transistor Q23 of the associated correction stage 203. Part of the electric current flowing to the shunting transistor Q22 flows to the base of the correction transistor Q34. Thus, the correction transistors Q23 and Q34 are turned on. Then, an electric current of I/8 flows through the correction transistor Q23 and the current source CS31, while an electric current of I/8 also flows through the correction transistor Q34 and the current source CS32.

Similarly, part of the electric current flowing to the output transistor Q31 of the fourth current division stage 104 flows to the base of the correction transistor Q33 of the associated correction stage 204. Part of the electric current flowing to the shunting transistor Q32 flows to the base of the correction transistor Q44. Thus, the correction transistors Q33 and Q44 are turned on. An electric current of I/16 flows through the correction transistor Q33 and the current source CS41, while an electric current of I/16 also flows through the correction transistor Q44 and the current source CS42.

The output currents I1, I2, I3 and I4 produced from the first to fourth current division circuits 101, 102, 103 and 104 will now be calculated.

Since the output current I1 is the sum of the collector current of the output transistor Q01 and the base current of the correction transistor Q03, it may be given by relation (10) below:

$$I1 = \frac{\alpha}{2} \times I + \frac{I}{2} \times \frac{\alpha}{\beta} = \frac{\beta I}{2(1+\beta)} + \frac{I}{2} \times \frac{\frac{\beta}{1+\beta}}{\beta} = \frac{\beta I}{2(1+\beta)} + \frac{I}{2(1+\beta)} = \frac{I}{2} \tag{10}$$

Similarly, the output current I2 is the sum of the collector current of the output transistor Q11 and the base current of the correction transistor Q13, and is given by relation (11) below:

$$I2 = \frac{\alpha}{2} \times I1 + \frac{I}{4} \times \frac{\alpha}{\beta} = \frac{\beta I}{4(1+\beta)} + \frac{I}{4} \times \frac{\frac{\beta}{1+\beta}}{\beta} = \frac{I}{4} \tag{11}$$

The output current I3 is the sum of the collector current of the output transistor Q21 and the base current of the composition transistor Q23, and is given by relation (12) below:

$$I3 = \frac{\alpha}{2} \times I2 + \frac{I}{8} \times \frac{\alpha}{\beta} = \frac{\beta I}{8(1+\beta)} + \frac{I}{8} \times \frac{\frac{\beta}{1+\beta}}{\beta} = \frac{I}{8} \tag{12}$$

Finally, the output current I4 is the sum of the collector current of the output transistor Q31 and the base current of the correction transistor Q33, and is given by relation (13) below:

$$I4 = \frac{\alpha}{2} \times I3 + \frac{I}{16} \times \frac{\alpha}{\beta} = \frac{\beta I}{16(1+\beta)} + \frac{I}{16} \times \frac{\frac{\beta}{1+\beta}}{\beta} = \frac{I}{16} \qquad (13)$$

From relation (10) above, the output current I1 becomes exactly $\frac{1}{2}$ the electric current I flowing to the current source CS01 and does not contain any error. In other words, of the current flowing to the collector of the output transistor Q01, the current flowing to the base of the transistor Q01 is compensated. The output current I1 thus corrected is obtained from the first current division stage 101, that is, the collector of the output transistor Q01. The sum of the emitter currents of the transistors Q11 and Q12 is equal to the sum of the collector current $\alpha/2 \cdot I$ of the transistor Q02 and the base current $\frac{1}{2} \times \alpha/\beta$ of the transistor Q14 and is equal to the output current I1.

The same applies to the output current I2 as well. As may be seen from relation (11) above, the output current I2 becomes exactly $\frac{1}{4}$ the electric current I flowing to the current source CS01, and the error is completely corrected.

In the case of the output current I3 as well, it becomes, as may be seen from relation (12) above, exactly $\frac{1}{8}$ the electric current I flowing to the current source CS01, and the error is completely corrected.

As may be seen from relation (13), the output current I4 becomes exactly 1/16 the electric current I flowing to the current source CS01, and the error is completely corrected.

As seen from the above description, with a current source circuit having the correction circuit 21 in addition to the current division circuit 20, the output currents I1, I2, I3 and I4 are completely corrected for the errors which are attributable to the base currents of the transistors of the current division circuit 20, the collectors of which receive the input currents.

In the current source circuit of the embodiment described above, the emitter current sources of the respective correction transistors include:

the current sources CS11 and CS12 for supplying electric current of I/2 to the correction transistors Q03 and Q14;

the current sources CS21 and CS22 for supplying electric current of I/4 to the correction transistors Q13 and Q24;

the current sources CS31 and CS32 for supplying electric current of I/8 to the correction transistors Q23 and Q34; and the current sources CS41 and CS42 for supplying electric current of I/16 to the correction transistors Q33 and Q44.

Figure 3:
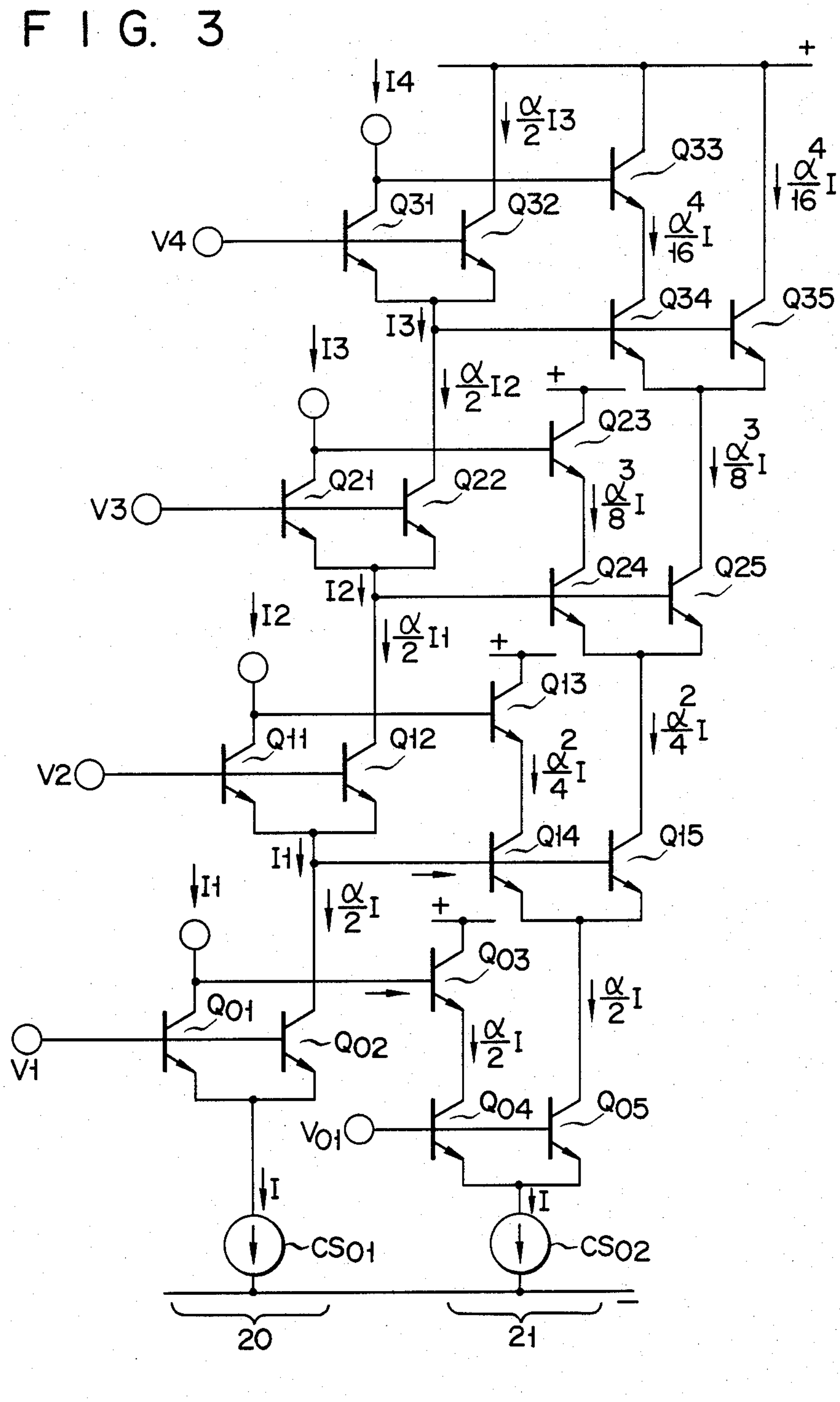
FIG. 3 is a view showing the current source circuit shown in FIG. 2 in further detail.

In order to obtain, from the current division circuit 20, the output currents I1, I2, I3 and I4 which are exactly $\frac{1}{2}$, $\frac{1}{4}$, $\frac{1}{8}$ and 1/16 the electric current I of the current source CS01, it becomes necessary to incorporate in the correction circuit 21 a current source for supplying the electric currents I/2, I/4, I/8 and I/16. However, this requirement may be satisfied by using a circuit of a configuration substantially the same as that of the current division circuit 20 as a circuit of the current sources for this purpose, as shown in FIG. 3. In the circuit shown in FIG. 3, in order to provide the correction function to the correction circuit, the circuit of the current sources further includes the npn transistors Q03, Q13, Q23 and Q33 inserted between the "+" potential and the output terminal (collector) of the output transistor of each correction stage (current division stage).

More specifically, transistors Q04 and Q05 are provided in correspondence with the transistors Q01 and Q02; transistors Q14 and Q15 for the transistors Q11 and Q12; transistors Q24 and Q25 for the transistors Q21 and Q22; and transistors Q34 and Q35 for the transistors Q31 and Q32. The transistor Q03 is connected between the "+" potential and the transistor Q04. The transistor Q13 is connected between the "+" potential and the transistor Q14. The transistor Q23 is connected between the "+" potential and the transistor Q24. The transistor Q33 is connected between the "+" potential and the transistor Q34.

The emitters of the transistors Q04 and Q05 are connected to the "−" potential through the current source CS02, and the bases thereof are supplied with a predetermined voltage V01. The emitters of the transistors Q14 and Q15 are connected to the collector of the transistor Q05, and the bases thereof are connected to the collector of the shunting transistor Q02. The emitters of the transistors Q24 and Q25 are connected to the collector of the transistor Q15, while the bases thereof are connected to the collector of the shunting transistor Q12. The emitters of the transistors Q34 and Q35 are connected to the collector of the transistor Q25, while the bases thereof are connected to the collector of the shunting transistor Q22.

The manner of obtaining the output currents I1, I2, I3 and I4 by the current source circuit of the configuration shown in FIG. 3 will now be explained.

Since the output current I1 is the sum of the collector current of the transistor Q01 and the base current of the transistor Q03, it is given by relation (14) below:

$$I1 = \frac{\alpha I}{2} + \frac{\alpha^2 I}{2\beta} = \frac{\beta I}{2(1+\beta)} + \frac{\frac{\beta^2}{(1+\beta)^2} \times I}{2\beta} = \frac{\beta I}{2(1+\beta)} + \frac{\beta I}{2(1+\beta)^2} = \frac{I}{2} \times \frac{\beta(2+\beta)}{2(1+\beta)^2} \qquad (14)$$

The output currents I2, I3 and I4 are similarly obtained by relations (15), (16) and (17) below:

$$I2 = \frac{\alpha I1}{2} + \frac{\alpha^3 I}{4\beta} = \frac{I}{4} \times \frac{\beta^2(2+\beta)}{(1+\beta)^3} + \frac{I}{4} \times \frac{\frac{\beta^3}{(1+\beta)^3}}{\beta} = \frac{I}{4} \times \frac{\beta^2(3+\beta)}{(1+\beta)^3} \qquad (15)$$

$$I3 = \frac{\alpha I2}{2} + \frac{\alpha^4 I}{8\beta} = \frac{I}{8} \times \frac{\beta^3(3+\beta)}{(1+\beta)^4} + \frac{I}{8} \times \frac{\frac{\beta^4}{(1+\beta)^4}}{\beta} = \frac{I}{8} \times \frac{\beta^2(4+\beta)}{(1+\beta)^4} \qquad (16)$$

$$I4 = \frac{\alpha I3}{2} + \frac{\alpha^5 I}{16\beta} = \frac{I}{16} \times \frac{\beta^4(4+\beta)}{(1+\beta)^5} + \frac{I}{16} \times \frac{\frac{\beta^5}{(1+\beta)^5}}{\beta} \qquad (17)$$

-continued $$= \frac{I}{16} \times \frac{\beta^4(5+\beta)}{(1+\beta)^5}$$

The errors of the output currents I1, I2, I3 and I4 given by relations above may be obtained from approximations of the output currents I1, I2, I3 and I4. The output currents I1, I2, I3 and I4 given by relations (14), (15), (16) and (17) above may be given by approximations below:

$$I1 = \frac{I}{2} \times \frac{\beta^2 + 2\beta}{\beta^2 + 2\beta + 1} = \frac{I}{2} \times \frac{1}{1 + \frac{1}{\beta^2 + 2\beta}} \approx \frac{I}{2}\left(1 - \frac{1}{\beta^2}\right) \quad (18)$$

$$I2 = \frac{I}{4} \times \frac{\beta^3 + 3\beta}{\beta^3 + 3\beta^2 + 3\beta + 1} = \frac{I}{4} \times \frac{1}{1 + \frac{3\beta + 1}{\beta^3 + 3\beta}} \approx \frac{I}{4}\left(1 - \frac{3}{\beta^2}\right) \quad (19)$$

$$I3 = \frac{I}{8} \times \frac{\beta^4 + 4\beta^3}{\beta^4 + 4\beta^3 + 6\beta^2 + 4\beta + 1} = \frac{I}{8} \times \frac{1}{1 + \frac{6\beta^2 + 4\beta + 1}{\beta^4 + 4\beta^3}} \approx \frac{I}{8}\left(1 - \frac{6}{\beta^2}\right) \quad (20)$$

$$I4 = \frac{I}{16} \times \frac{\beta^5 + 5\beta^4}{\beta^5 + 5\beta^4 + 10\beta^3 + 10\beta^2 + 5\beta + 1} = \frac{I}{16} \times \frac{1}{1 + \frac{10\beta^3 + 10\beta^2 + 5\beta + 1}{\beta^5 + 5\beta^4}} \approx \frac{I}{16}\left(1 - \frac{10}{\beta^2}\right) \quad (21)$$

If $\beta$ is given as 100, the errors of the output currents I1, I2, I3 and I4 are obtained from relations (18) to (21) above as follows:

Error of the output current I1: −0.01%
Error of the output current I2: −0.03%
Error of the output current I3: −0.06%
Error of the output current I4: −0.10%

It is thus seen that the current errors with the current source circuit shown in FIG. 3 are improved in the order of one digit as compared to those with the conventional current source circuit shown in FIG. 1.

Figure 4:
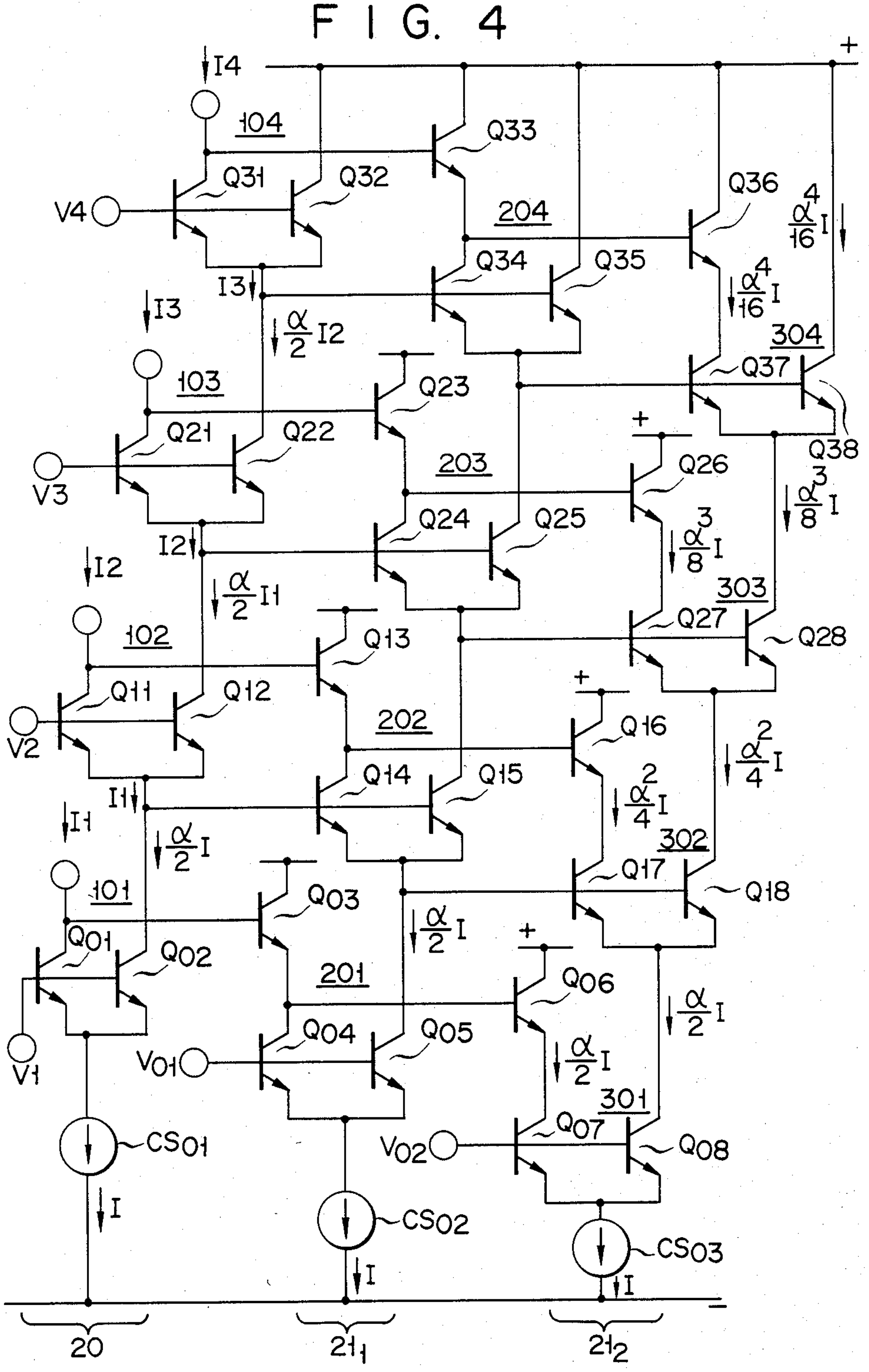
FIG. 4 is a circuit diagram of the current source circuit shown in FIG. 3 with a tertiary correction circuit.

FIG. 4 shows another embodiment of the present invention. In the embodiment shown in FIG. 3, as may be seen from relations (18) to (21), one current correction circuit is used to perform correction of the errors of the output currents I1, I2, I3 and I4 to the square term of the current amplification factor (secondary correction). In contrast to this, the embodiment shown in FIG. 4 further has a second current correction circuit which corrects the errors of the output currents of the first current correction circuit, thereby performing the correction of the errors of the output currents I1, I2, I3 and I4 of the current division circuit to the cubed term of the current amplification factor $\beta$ (tertiary correction).

The configuration of the circuit of this embodiment is basically the same as that shown in FIG. 3 except that a second current correction circuit $21_2$ of substantially the same configuration is added to the current correction circuit 21. For the sake of simplicity, the correction circuit corresponding to the current correction circuit 21 in FIG. 3 is denoted by reference numeral $21_1$. Therefore, a description will be made only of the configuration of the second current correction circuit $21_2$ and its connections to the first current correction circuit $21_1$. The same reference numerals as in FIG. 3 denote the same parts, and a description thereof will be omitted.

Referring to FIG. 4, transistors Q06, Q07, Q08, Q16, Q17, Q18, Q26, Q27, Q28, Q36, Q37 and Q38 are all npn transistors. The transistors Q06, Q07 and Q08 are provided in correspondence with the transistors Q03, Q04 and Q05. The transistors Q16, Q17 and Q18 are provided in correspondence with the transistors Q13, Q14 and Q15. The transistors Q26, Q27 and Q28 are provided in correspondence with the transistors Q23, Q24 and Q25. Finally, the transistors Q36, Q37 and Q38 are provided in correspondence with the transistors Q33, Q34 and Q35.

The emitters of the transistors Q07 and Q08 are connected to the "−" potential through the current source CS03; to their bases is applied a predetermined voltage V02. The collector of the transistor Q06 is connected to the "+" potential, the emitter thereof is connected to the collector of the transistor Q07, and the base thereof is connected to the collector of the transistor Q04.

The emitters of the transistors Q17 and Q18 are connected to the collector of the transistor Q08, and the bases thereof are connected to the collector of the transistor Q05. The collector of the transistor Q16 is connected to the "+" potential, while the emitter thereof is connected to the collector of the transistor Q17. The base of the transistor Q16 is connected to the collector of the transistor Q14.

The emitters of the transistors Q27 and Q28 are connected to the collector of the transistor Q18. The bases of the transistors Q27 and Q28 are connected to the collector of the transistor Q15. The collector of the transistor Q26 is connected to the "+" potential, and the emitter thereof is connected to the collector of the transistor Q27. The base of the transistor Q26 is connected to the collector of the transistor Q24. The emitters of the transistors Q37 and Q38 are connected to the collector of the transistor Q28, and the bases thereof are connected to the collector of the transistor Q25. The collector of the transistor Q38 is connected to the "+" potential. The collector of the transistor Q36 is connected to the "+" potential, the emitter thereof is connected to the collector of the transistor Q37, and the base thereof is connected to the collector of the transistor Q34.

Since the second current correction circuit $21_2$ of the configuration as described above is of substantially the same configuration as that of the first current correction circuit $21_1$, it operates in substantially the same manner. Therefore, the mode of operation will not be described.

The output currents I1, I2, I3 and I4 of the circuit shown in FIG. 4 are obtained as follows:

(22)

$$
\begin{aligned}
I1 &= \frac{\alpha}{2} \times I + \frac{\alpha}{\beta}\left(\frac{\alpha}{2} I + \frac{\alpha^2}{2\beta} I\right) \\
&= \frac{\beta I}{2(1+\beta)} + \frac{1}{1+\beta}\left\{\frac{\beta}{2(1+\beta)} + \frac{\beta}{2(1+\beta)^2}\right\} I \\
&= \frac{\beta I}{2(1+\beta)} + \frac{\beta(2+\beta)}{2(1+\beta)^3} \\
&= \frac{I}{2} \times \frac{\beta(1+\beta)^2 + (2+\beta)}{(1+\beta)^3} \\
&= \frac{I}{2} \times \frac{\beta^3 + 3\beta^2 + 3\beta}{1 + 3\beta + 3\beta^2 + \beta^3} \\
&= \frac{I}{2} \times \frac{1}{1 + \frac{1}{\beta^3 + 3\beta^2 + 3\beta}} \\
&\simeq \frac{I}{2}\left(1 - \frac{1}{\beta^3}\right)
\end{aligned}
$$

(23)

$$
\begin{aligned}
I2 &= \frac{\alpha I1}{2} + \frac{\alpha}{\beta}\left\{\frac{\alpha}{2}\left(\frac{\alpha I}{2} + \frac{\alpha^2 I}{2\beta}\right) + \frac{\alpha^3 I}{4\beta}\right\} \\
&= \frac{\beta I1}{2(1+\beta)} + \frac{I}{1+\beta}\left\{\frac{\beta}{2(1+\beta)}\left(\frac{\beta}{2(1+\beta)} + \frac{\beta}{2(1+\beta)^2}\right) + \frac{\beta^2}{4(1+\beta)^3}\right\} \\
&= \frac{\beta\{\beta(1+\beta)^2 + \beta(2+\beta)\}I}{4(1+\beta)^4} + \frac{\beta^2(3+\beta)I}{4(1+\beta)^4} \\
&= \frac{\beta^2\{(1+\beta)^2 + (5+2\beta)\}I}{4(1+\beta)^4} \\
&= \frac{I}{4} \times \frac{\beta^4 + 4\beta^3 + 6\beta^2}{1 + 4\beta + 6\beta^2 + 4\beta^3 + \beta^4} \\
&= \frac{I}{4} \times \frac{1}{1 + \frac{4\beta + 1}{\beta^4 + 4\beta^3 + 6\beta^2}} \\
&\simeq \frac{I}{4}\left(1 - \frac{4}{\beta^3}\right)
\end{aligned}
$$

(24)

$$
\begin{aligned}
I3 &= \frac{\alpha}{2} \times I2 + \frac{\alpha}{\beta}\left(\frac{\alpha}{2}\left\{\frac{\alpha}{2}\left(\frac{\alpha I}{2} + \frac{\alpha^2 I}{2\beta}\right) + \frac{\alpha^3 I}{4\beta}\right\} + \frac{\alpha^4 I}{8\beta}\right) \\
&= \frac{\beta^3\{(1+\beta)^2 + (5+2\beta)\}I}{8(1+\beta)^5} + \\
&\quad \frac{I}{(1+\beta)}\left(\frac{\beta}{2(1+\beta)}\left\{\frac{\beta}{2(1+\beta)}\left(\frac{\beta}{2(1+\beta)} + \frac{\beta}{2(1+\beta)^2}\right) + \frac{\beta^2}{4(1+\beta)^3}\right\} + \frac{\beta^3}{8(1+\beta)^4}\right) \\
&= \frac{\beta^3\{(1+\beta)^2 + (5+2\beta)\}I}{8(1+\beta)^5} + \\
&\quad \frac{I}{(1+\beta)}\left(\frac{\beta}{2(1+\beta)}\left\{\frac{\beta}{2(1+\beta)} \times \frac{\beta(\beta+2)}{2(1+\beta)^2} + \frac{\beta^2}{4(1+\beta)^3}\right\} + \frac{\beta^3}{8(1+\beta)^4}\right) \\
&= \frac{\beta^3\{(1+\beta)^2 + (5+2\beta)\}I}{8(1+\beta)^5} + \\
&\quad \frac{I}{(1+\beta)}\left(\frac{\beta}{2(1+\beta)} \times \frac{\beta^2(\beta+3)}{4(1+\beta)^3} + \frac{\beta^3}{8(1+\beta)^4}\right) \\
&= \frac{\beta^3\{(1+\beta)^2 + (5+2\beta)\}I}{8(1+\beta)^5} + \frac{I}{(1+\beta)} \times \frac{\beta^3(\beta+4)}{8(1+\beta)^4} \\
&= \frac{I}{8} \times \frac{\beta^3\{(1+\beta)^2 + (9+3\beta)\}}{(1+\beta)^5} \\
&= \frac{I}{8} \times \frac{\beta^5 + 5\beta^4 + 10\beta^3}{1 + 5\beta + 10\beta^2 + 10\beta^3 + 5\beta^4 + \beta^5} \\
&\simeq \frac{I}{8}\left(1 - \frac{10}{\beta^3}\right)
\end{aligned}
$$

(25)

$$
I4 = \frac{\alpha I3}{2} + \frac{\alpha I}{\beta}\left(\frac{\alpha}{2}\left(\frac{\alpha}{2}\left\{\frac{\alpha}{2}\left(\frac{\alpha}{2} + \frac{\alpha^2}{2\beta}\right) + \frac{\alpha^3}{4\beta}\right\} + \frac{\alpha^4}{8\beta}\right) + \frac{\alpha^5}{16\beta}\right)
$$

$$
A: \frac{\alpha}{2} + \frac{\alpha^2}{2\beta} = \frac{\beta}{2(1+\beta)} + \frac{\beta}{2(1+\beta)^2} = \frac{\beta(2+\beta)}{2(1+\beta)^2}
$$

$$
B: \frac{\alpha}{2} \times (A) + \frac{\alpha^3}{4\beta} = \frac{\beta^2(2+\beta)}{4(1+\beta)^3} + \frac{\beta^2}{4(1+\beta)^3} = \frac{\beta^2(3+\beta)}{4(1+\beta)^3}
$$

$$
C: \frac{\alpha}{2} \times (B) + \frac{\alpha^4}{8\beta} = \frac{\beta^3(3+\beta)}{8(1+\beta)^4} + \frac{\beta^3}{8(1+\beta)^4} = \frac{\beta^3(4+\beta)}{8(1+\beta)^4}
$$

$$
D: \frac{\alpha}{2} \times (C) + \frac{\alpha^5}{16\beta} = \frac{\beta^4(4+\beta)}{16(1+\beta)^5} + \frac{\beta^4}{16(1+\beta)^5} = \frac{\beta^4(5+\beta)}{16(1+\beta)^5}
$$

$$
\begin{aligned}
I4 &= \frac{\alpha I3}{2} + \frac{\alpha I}{\beta} \times (D) \\
&= \frac{\beta^4\{(1+\beta)^2 + (9+3\beta)\}I}{16(1+\beta)^6} + \frac{\beta^4(5+\beta)I}{16(1+\beta)^6} \\
&= \frac{I}{16} \times \frac{\beta^6 + 6\beta^5 + 15\beta^4}{(1+\beta)^6} \\
&= \frac{I}{16} \times \frac{\beta^6 + 6\beta^5 + 15\beta^4}{1 + 6\beta + 15\beta^2 + 20\beta^3 + 15\beta^4 + 6\beta^5 + \beta^6}
\end{aligned}
$$

-continued $$\approx \frac{I}{16}\left(1 - \frac{20}{\beta^3}\right)$$

If $\beta$ is given as 100, the errors of the output currents I1, I2, I3 and I4 are obtained by approximations (22) to (25) as follows:

Error of the output current I1: 0.0001%

Error of the output current I2: 0.004%

Error of the output current I3: 0.001%

Error of the output current I4: 0.002%

It is seen from these results that smaller errors are obtained by the tertiary correction than the secondary correction.

In a relation $(1+x)^2$, the relationship between "n" and the factors of each term of the expansion satisfies Table 1 below (Pythagorean triangle):

TABLE 1

| n | |
|---|---|
| | 1 |
| 1 | 1 1 |
| 2 | 1 2 1 |
| 3 | 1 3 3 1 |
| 4 | 1 4 6 4 1 |
| 5 | 1 5 10 10 5 1 |
| 6 | 1 6 15 20 15 6 1 |
| 7 | 1 7 21 35 35 21 7 1 |
| . | |
| . | |
| . | |
| | (A) (B) (C) |

The errors of the output currents I1, I2, I3 and I4 of the conventional current source circuit shown in FIG. 1 are obtained as $1/\beta$, $2/\beta$, $3/\beta$ and $4/\beta$ from relations (6), (7), (8) and (9), which correspond to a row (A) of Table 1 below.

On the other hand, with the current source circuit of the embodiment of the present invention shown in FIG. 3 wherein the correction is performed to the squared term of "$\beta$", the errors of the output currents I1, I2, I3 and I4 are obtained as $1/\beta^2$, $3/\beta^2$, $6/\beta^2$, and $10/\beta^2$ from relations (18), (19), (20) and (21), which correspond to a row (B) of Table 1 above.

Finally, with the current source circuit of the embodiment of the present invention shown in FIG. 4 wherein the correction is made to the cubed term of "$\beta$", the errors of the output currents I1, I2, I3 and I4 are obtained as $1/\beta^3$, $4/\beta^3$, $10/\beta^3$, and $20/\beta^3$, which correspond to a row (C) of Table 1 above.

Therefore, the errors of the output currents I1, I2, I3 and I4 may be easily approximated from the relationships shown in Table 1 in cases where the correction is to be made to term of the fourth power or higher.

The relationships between the number of the output currents (the number of bits) and the errors of the output currents in the conventional current source circuit shown in FIG. 1 and the current source circuits of the embodiments of the present invention shown in FIGS. 3 and 4 are as shown in Table 2 below. The errors in Table 2 are obtained assuming that "$\beta$" is 100.

TABLE 2

| | | Current Error | | |
|---|---|---|---|---|
| Number of Bits | Rated Accuracy (½ LSB) | Prior Art (FIG. 1) | Secondary Correction (FIG. 3) | Tertiary Correction (FIG. 4) |
| 4 | 3.2% | 4% | 0.1% | 0.002% |
| 5 | 1.6% | 5% | 0.15% | 0.0035% |
| 6 | 0.78% | | 0.21% | 0.0056% |
| 7 | 0.39% | | 0.28% | 0.0084% |
| 8 | 0.20% | | 0.36% | 0.012% |
| 9 | 0.098% | | | 0.0165% |
| 10 | 0.049% | | | 0.0220% |
| 11 | 0.024% | | | 0.0286% |
| 12 | 0.012% | | | 0.0364% |
| 13 | 0.0061% | | | |
| 14 | 0.0031% | | | |
| 15 | 0.0015% | | | |
| | | (A) | (B) | (C) |

As may be seen from Table 2 above, with the conventional current source circuit shown in FIG. 1, the current output satisfies the rated accuracy of the D/A converter up to three output currents (three stages or three bits). When the number of stages exceeds four, the rated accuracy cannot be satisfied. In contrast to this, with the current source circuit of the present invention shown in FIG. 3 which performs up to the secondary correction, the rated accuracy can be satisfied up to seven stages (7 bits). But, with the current source circuit shown in FIG. 4 which performs up to the tertiary correction, the rated accuracy can be satisfied, up to ten stages or ten bits.

Figure 5:
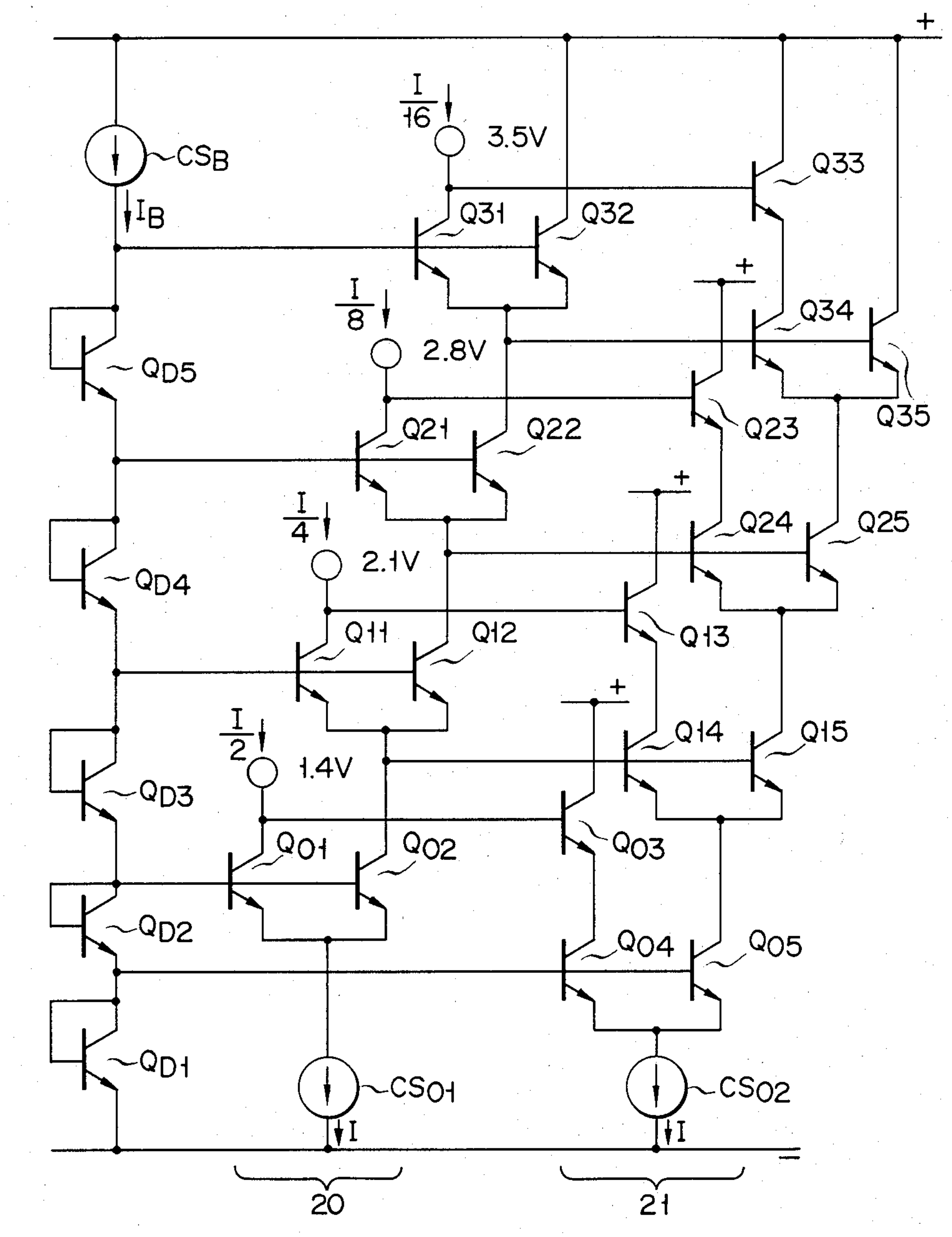
FIG. 5 is a circuit diagram of the current source circuit shown in FIG. 3 with a biasing transistor circuit.

FIG. 5 shows a circuit for simulation experiments which corrects the error to the squared term of the current amplification factor $\beta$. This circuit is obtained by adding biasing transistors QD1 to QD5 for producing voltages V01, V1, V2, V3 and V4 for biasing to the circuit shown in FIG. 3. Therefore, the same reference numerals as in FIG. 3 denote the same parts, and a description thereof will be omitted. The transistors QD1, QD2, QD3, QD4 and QD5 are series-connected between the "+" potential and the "−" potential through a current source CSB. The collector and base of each of these transistors are commonly connected, so that the transistor may function as a diode element. The emitter of the transistor QD1 is connected to the "−" potential, and the collector thereof is connected to the emitter of the transistor QD2 as well as to the bases of the transistors Q04 and Q05. The collector of the transistor QD2 is connected to the emitter of the transistor QD3 as well as to the bases of the transistors Q01 and Q02. The collector of the transistor QD3 is connected to the emitter of the transistor QD4 as well as to the bases of the transistors Q11 and Q12. The collector of the transistor QD4 is connected to the emitter of the transistor QD5 as well as to the bases of the transistors Q21 and Q22. The collector of the transistor QD5 is connected through the current source CSB to the "+" potential as well as to the bases of the transistors Q31 and Q32.

Figure 6:
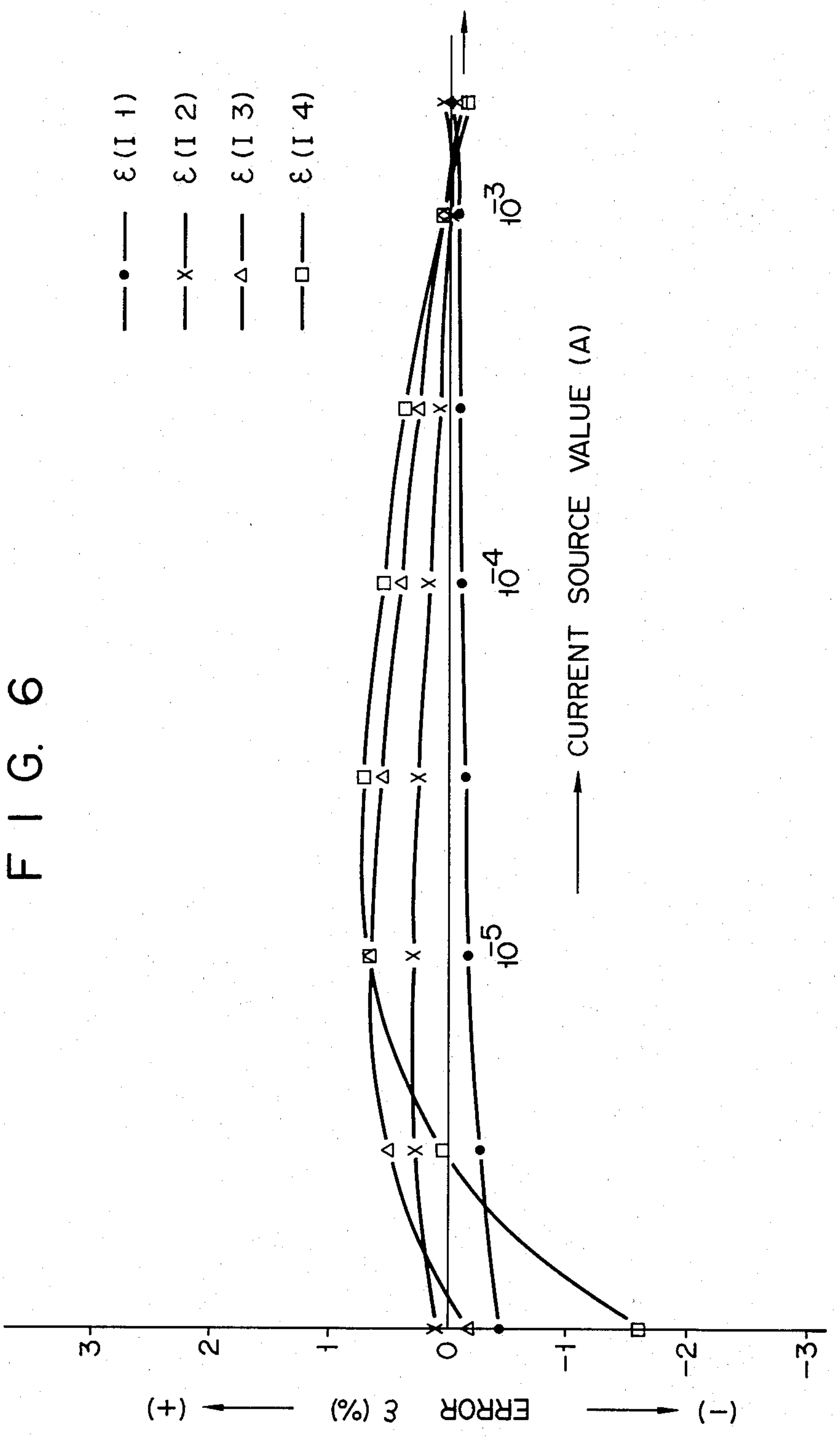
FIG. 6 is a graph showing current source value vs. error characteristics of the current source circuit shown in FIG. 3.

A current valve IB of the current source CSB is, for example, 100 μA. The "+" potential of the first power source is, for example, 4 V, and the "−" potential of the second power source is, for example, ground potential. Since the biasing transistors QD1, QD2, QD3, QD4 and QD5 are incorporated, bias voltages of 0.7 V, 1.4 V, 2.1 V, 2.8 V, and 3.5 V, for example, are respectively applied to the transistors Q04 and Q05, Q01 and Q02, Q11 and Q12, Q21 and Q22, and Q31 and Q32. Under these conditions, the current values of the current sources CS01 and CS02 were varied within the range of 1 μA to 2 mA. Changes in the output currents I1, I2, I3 and I4 are shown in Table 3 below while changes in the errors in the output currents are shown in Table 4 below. FIG. 6 also shows, in the form of a graph, the changes in the errors shown in Table 4.

TABLE 3

| | (Output Current) | | | | | | | |
|---|---|---|---|---|---|---|---|---|
| I | 1 μA | 3 μA | 10 μA | 30 μA | 100 μA | 300 μA | 1 mA | 2 mA |
| I1 | 0.4978 | 1.496 | 4.992 | 14.98 | 49.96 | 149.9 | 0.4998 | 0.9999 |
| I2 | 0.2502 | 0.7520 | 2.507 | 7.518 | 25.04 | 75.08 | 0.2500 | 0.4997 |
| I3 | 0.1248 | 0.3768 | 1.258 | 3.771 | 12.55 | 37.55 | 0.1251 | 0.2499 |
| I4 | 0.0615 | 0.1876 | 0.6290 | 1.888 | 6.284 | 18.82 | 0.06255 | 0.1248 |

TABLE 4

| | (Error) | | | | | | | |
|---|---|---|---|---|---|---|---|---|
| I | 1 μA | 3 μA | 10 μA | 30 μA | 100 μA | 300 μA | 1 mA | 2 mA |
| ε(I1) | −0.44% | −0.27% | −0.16% | −0.13% | −0.08% | −0.07% | −0.04% | −0.01% |
| ε(I2) | 0.08% | 0.27% | 0.28% | 0.24% | 0.16% | 0.11% | 0% | 0.06% |
| ε(I3) | −0.17% | 0.49% | 0.64% | 0.56% | −0.40% | 0.27% | 0.08% | −0.04% |
| ε(I4) | −1.60% | 0.05% | 0.64% | 0.69% | 0.54% | 0.37% | 0.08% | −0.16% |

As may be seen from Table 4 and the graph of FIG. 6, the errors take the minimum values when the current values of the current sources CS01 and CS02 are about 1 mA. This is attributable to the fact that the transistors used in the circuit subjected to the experiments optimally operate within a current range of 1 mA.

Figure 7:
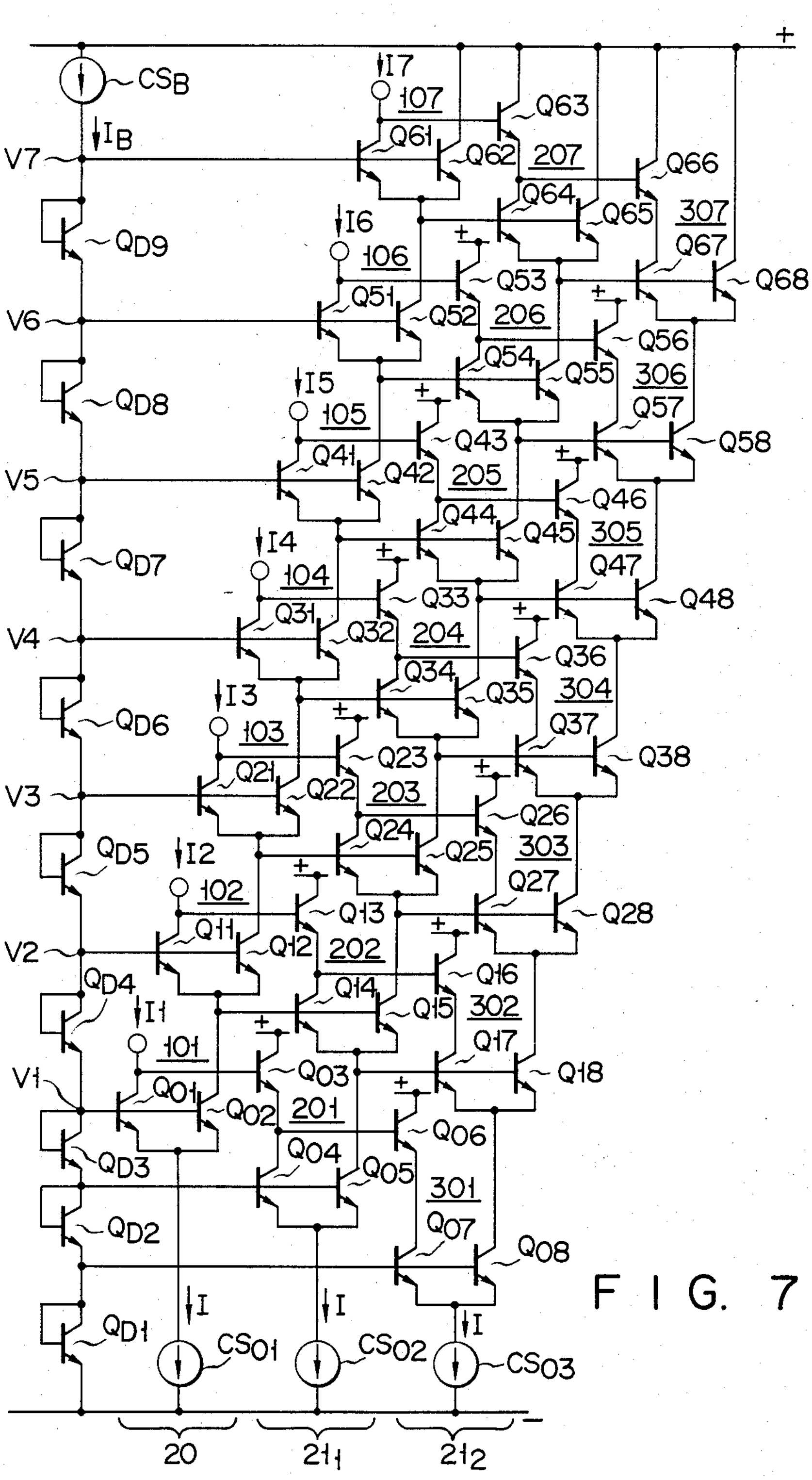
FIG. 7 is a circuit diagram of a current source circuit according to another embodiment of the present invention which is of 7-bit configuration and which has secondary and tertiary correction circuits.

FIG. 7 shows a current source circuit according to another embodiment of the present invention. This current source circuit corrects the error to the squared term of the current amplification factor β and is of 7-bit (seven stage) configuration. The circuit shown in FIG. 7 is obtained by adding three more stages of transistors to the circuit of the 4-bit (four stage) configuration as shown in FIG. 4. The transistors added are biasing transistors as shown in FIG. 5. Therefore, the same reference numerals as in FIGS. 4 and 5 denote the same parts, and a description thereof will not be made.

Referring to FIG. 7, the current output circuit 20 has, in addition to the output stages shown in FIG. 4, a fifth current output stage (current division stage) 105 consisting of an output transistor Q41 and a shunting transistor Q42, a sixth current division stage 106 consisting of an output transistor Q51 and a shunting transistor Q52, and a seventh current division stage 107 consisting of an output transistor Q61 and a shunting transistor Q62. The emitters of the transistors Q41 and Q42 are connected to the collector of the transistor Q32, while the bases thereof are commonly connected to the collector of a biasing transistor QD7. The collector of the output transistor Q41 serves as the output terminal of an output current I5. The emitters of the transistors Q51 and Q52 are connected to the collector of the transistor Q42, while the bases thereof are commonly connected to the collector of a biasing transistor QD8. The collector of the output transistor Q51 serves as the output terminal of an output current I6. The emitters of the transistors Q61 and Q62 are connected to the collector of the shunting transistor Q52, while the bases thereof are commonly connected to the collector of a biasing transistor QD9. The collector of the output transistor Q61 serves as the output terminal of an output current I7.

The first correction circuit $21_1$ has, in addition to the first through fourth correction stages 201, 202, 203 and 204 shown in FIG. 4, three correction stages, fifth, sixth and seventh correction stages 205, 206 and 207. The fifth correction stage 205 consists of transistors Q44, Q45 and Q43. The sixth correction stage 206 consists of transistors Q54, Q55 and Q53. The seventh correction stage 207 consists of transistors Q64, Q65 and Q63. The emitters of the transistors Q44 and Q45 are connected to the collector of the transistor Q35, and the bases thereof are connected to the collector of the shunting transistor Q32. The collector of the transistor Q44 is connected to the emitter of the transistor Q43. The collector of the transistor Q43 is connected to the "+" potential, and the base thereof is connected to the collector of the transistor Q41. The emitters of the transistors Q54 and Q55 are connected to the collector of the transistor Q45, while the bases thereof are commonly connected to the collector of the transistor Q42. The collector of the transistor Q54 is connected to the transistor Q53. The collector of the transistor Q53 is connected to the "+" potential, and the base thereof is connected to the collector of the transistor Q51. The emitters of the transistors Q64 and Q65 are connected to the collector of the transistor Q55, while the bases thereof are connected to the collector of the transistor Q52. The emitter of the transistor Q64 is connected to the emitter of the transistor Q65. The collector of the transistor Q63 is connected to the "+" potential, while the base thereof is connected to the collector of the output transistor Q61.

The second correction circuit $21_2$ has, in addition to the first through fourth correction stages 301, 302, 303 and 304, fifth to seventh correction stages 305, 306 and 307. The fifth correction stage 305 consists of transistors Q47, Q48 and Q46. The sixth correction stage 306 consists of transistors Q57, Q58 and Q56. The seventh stage 307 consists of transistors Q67, Q68 and Q66. The emitters of the transistors Q47 and Q48 are connected to the collector of the transistor Q38, while the bases thereof are commonly connected to the collector of the transistor Q35. The collector of the transistor Q47 is connected to the emitter of the transistor Q46. The collector of the transistor Q46 is connected to the "+" potential, while the base thereof is connected to the collector of the transistor Q44. The emitters of the transistors Q57 and Q58 are connected to the collector of the transistor Q48. The bases of the transistors Q57 and Q58 are commonly connected to the collector of the transistor Q45. The collector of the transistor Q57 is connected to the emitter of the transistor Q56. The collector of the transistor Q56 is connected to the "+" potential, while the base thereof is connected to the base of the transistor Q54. The emitters of the transistors Q67 and Q68 are connected to the collector of the transistor Q58, while the bases thereof are commonly connected to the collector of the transistor Q55. The collector of the transistor Q68 is connected to the "+" potential, and the collector of the transistor Q67 is connected to the emitter of the transistor Q66. The collector of the transistor Q66 is connected to the "+" potential, while the base thereof is connected to the collector of the transistor Q64.

The current source circuit of the 7-bit configuration as described above operates basically in the same manner as the circuit of the 4-bit configuration shown in FIGS. 4 and 5. Therefore, the mode of operation of the circuit shown in FIG. 7 will not be described.

In the current source circuits of the embodiments described above, $\frac{1}{2}$ current division is performed in each current division stage; $\frac{1}{2}$, $\frac{1}{4}$, $\frac{1}{8}$ and 1/16 of the electric current I of the current source are respectively obtained from the current division stages 101, 102, 103 and 104. However, the present invention is not limited to the embodiments described above and may be applied to circuits wherein the current division ratios are different in respective stages.

Figure 8:
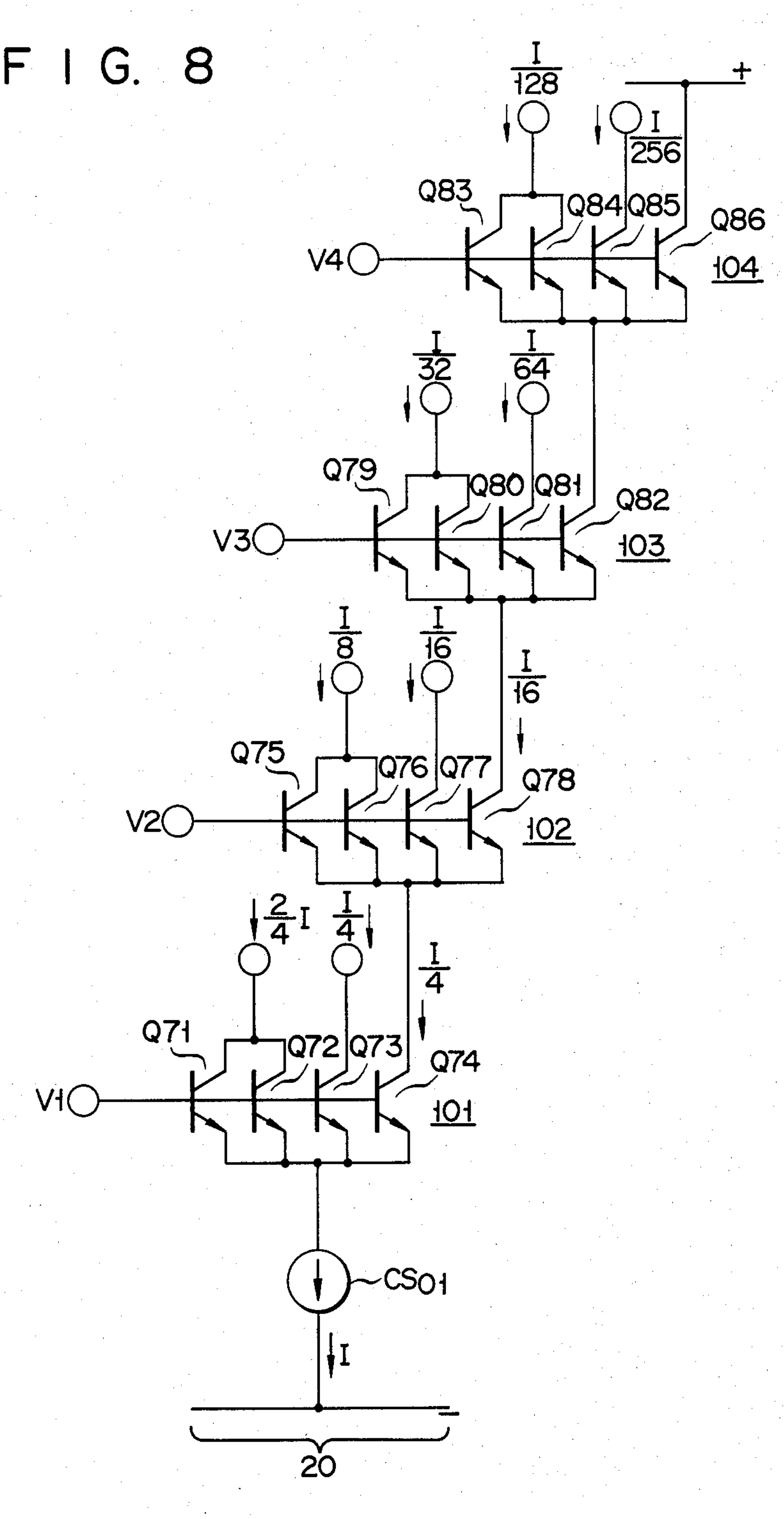
FIGS. 8 to 16 are circuit diagrams showing current source circuits according to other embodiments of the present invention.

FIG. 8 shows another embodiment of the present invention wherein each current division stage has four transistors for dividing the electric current into four output currents, the output current which is $\frac{1}{4}$ the input electric current is obtained from one of the four transistors, and the collectors of two transistors among the four transistors are commonly connected to obtain the current output $\frac{1}{2}$ the input electric current. With the circuit of this configuration, output currents which are $\frac{1}{4}$ and $\frac{1}{2}$ the electric current I of the current source CS01 are obtained from the first current division stage 101. Output currents I/16 and I/8 are obtained from the second current division stage 102. Output currents I/64 and I/32 are obtained from the third current division stage 103. Finally, output currents I/256 and I/128 are obtained from the forth current division stage 104.

The configuration of the current division circuit shown in FIG. 8 will now be described. All the transistors constituting the current division stages are npn transistors. Transistors Q71, Q72, Q73 and Q74 constitute the first current division stage 101. The emitters of the transistors Q71, Q72, Q73 and Q74 are connected to the "−" potential through the current source CS01, while the bases thereof are connected to a predetermined voltage V1. The collectors of the transistors Q71 and Q72 are commonly connected, and a junction thereof serves as the output terminal of the output current I/2. The collector of the transistor Q73 serves as the output terminal of the output current I/4. Transistors Q75, Q76, Q77 and Q78 constitute the second current division stage. The emitters of the transistors Q75, Q76, Q77 and Q78 are connected to the collector of the transistor Q74 of the first current division stage 101, while the bases thereof are commonly connected to a predetermined voltage V2. The collectors of the transistors Q75 and Q76 are commonly connected to provide the output terminal of the output current I/8. The collector of the transistor Q77 serves as the output terminal of the output current I/16. Transistors Q79, Q80, Q81 and Q82 constitute the third current division stage 103. The emitters of the transistors Q79, Q80, Q81 and Q82 are commonly connected to the collector of the transistor Q78, while the bases thereof are commonly connected to a predetermined voltage V3. The collectors of the transistors Q79 and Q80 are commonly connected to provide the output terminal of the output current I/32. The collector of the transistor Q81 provides the output terminal of the output current I/64. Transistors Q83, Q84, Q85 and Q86 constitute the fourth current division stage 104. The emitters of these transistors Q83, Q84, Q85 and Q86 are commonly connected to the collector of the transistor Q82, while the bases thereof are commonly connected to a predetermined voltage V4. The collectors of the transistors Q83 and Q84 are commonly connected to provide the output terminal of the output current I/128. The collector of the transistor Q85 serves as the output terminal of the output current I/256. The collector of the transistor Q86 is connected to the "+" potential.

With the circuit of the configuration as described above, when the predetermined voltages V1, V2, V3 and V4 are applied to the respective current division stages, the transistors in all the current division stages are turned on. Thus, electric currents flow through the collector-emitter paths of the respective transistors. The electric current $\frac{1}{4}$ the electric current I of the current source CS01, that is, I/4 flows to the transistors Q71, Q72, Q73 and Q74 of the first current division stage. Therefore, the output current I/4 is obtained from the collector of the transistor Q73. Since the collectors of the transistors Q71 and Q72 are commonly connected, the sum of the currents flowing through the transistors Q71 and Q72, that is, 2/4·I (=I/2) is obtained from the junction therebetween. The electric current I/4 flows to the third current division stage is is divided into four currents by the transistors Q75, Q76, Q77 and Q78. Therefore, the output current I/16 is obtained from the collector of the transistor Q77. Since the collectors of the transistors Q75 and Q76 are commonly connected, the sum of the currents flowing through the transistors Q75 and Q76, that is, I/8 is obtained from the junction therebetween. The same applies to the third current division stage 103. Specifically, the electric current I/16 is divided into four currents by the transistors Q79, Q80, Q81 and Q82. Thus, the output current I/64 is obtained from the collector of the transistor Q81. Since the collectors of the transistors Q79 and Q80 are commonly connected, the sum of the electric currents flowing through the transistors Q79 and Q80, that is, I/32 is obtained from the junction therebetween. Similarly, in the fourth current division stage 104, the electric current I/64 is divided by the transistors Q83, Q84, Q85 and Q86. Therefore, the output current I/256 is obtained from the collector of the transistor Q85. Since the collectors of the transistors Q83 and Q84 are commonly connected, the sum of the electric currents flowing through the transistors Q83 and Q84, that is, I/128 is obtained from the junction therebetween.

In the embodiment shown in FIG. 8, it is possible to obtain output currents of great division ratios with a small number of current division stages. This indicates that the number of current division stages may be decreased as compared to the conventional circuit. Therefore, the range of the power source voltage can also be made narrower.

Figure 9:
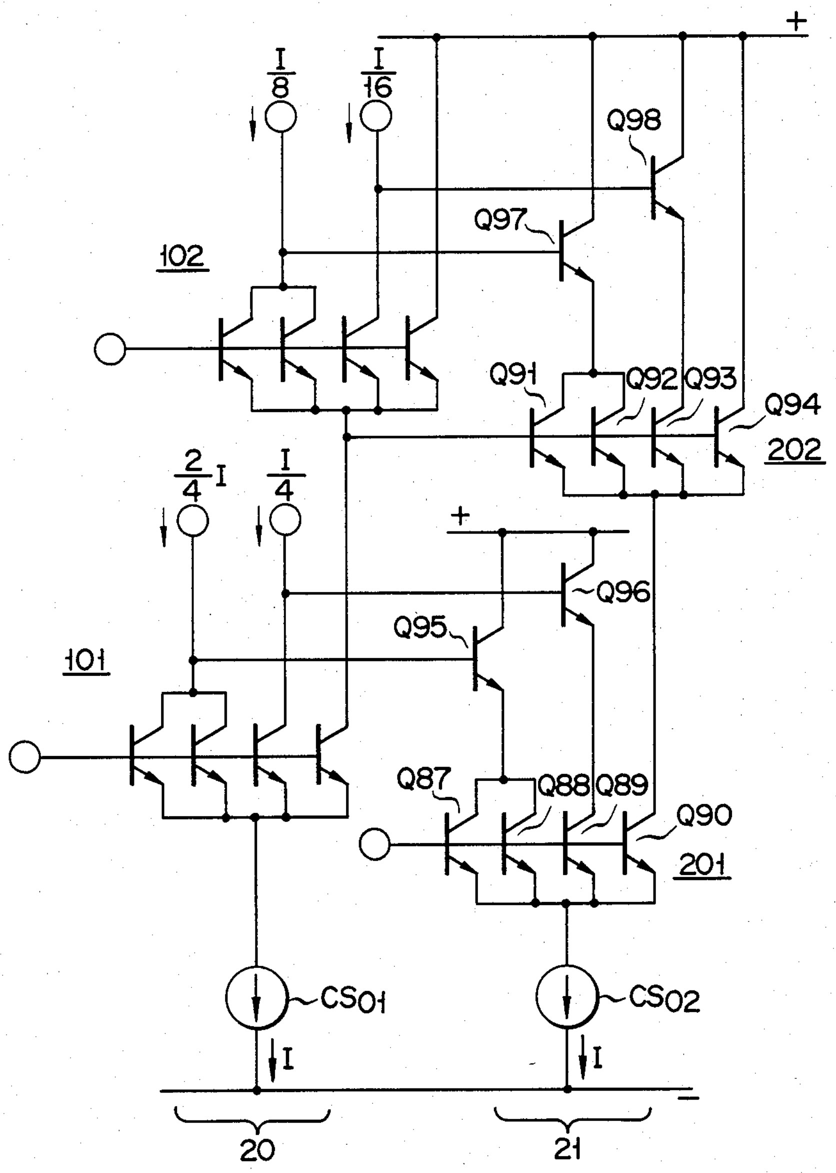

FIG. 9 shows a current source circuit wherein the correction circuit 21 is added to the current division circuit 20 shown in FIG. 8. Although the current division circuit shown in FIG. 8 has four current division stages, it is shown to be of the 4-bit (two stages) configuration in FIG. 9 for the sake of simplicity. The correction circuit 21 of FIG. 9 has the current division circuit and the correction transistors shown in FIG. 8. As in the case of the circuit shown in FIG. 3, the circuit of FIG. 9 includes transistor stages 201 and 202 of substantially the same configuration as the current division stages 101 and 102. Thus, the transistor stage 201 consisting of transistors Q87, Q88, Q89 and Q90 and of the same configuration as that of the current division stage 101 is incorporated in correspondence therewith. Similarly, the transistor stage 202 consisting of transistors Q91, Q92, Q93 and Q94 and of the same configuration as that of the current division stage 102 is incorporated in correspondence therewith. Transistors Q95 and Q96 are correction transistors, and correspond to the correction transistors Q03 and Q04 in the embodiment shown in FIG. 2. Transistors Q97 and Q98 are also correction transistors, and correspond to the transistors Q13 and Q24 in the embodiment shown in FIG. 2. The transistor stage 201 is connected to the "−" potential through the current source CS02.

Figure 10:
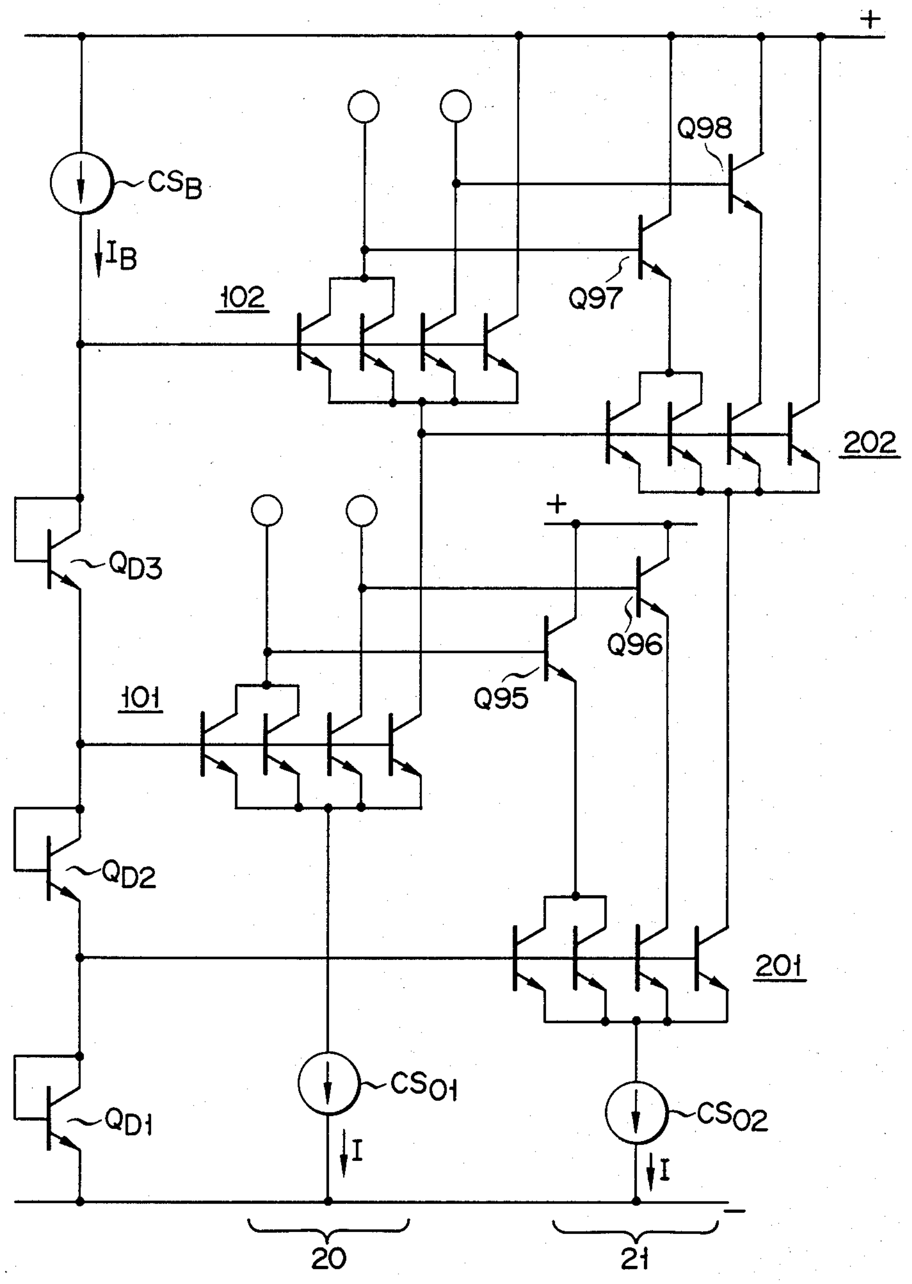

FIG. 10 shows a current source circuit in which a biasing transistor circuit is added to the circuit shown in FIG. 9. The biasing transistor circuit comprises transistors QD1, QD2 and QD3.

Figure 11:
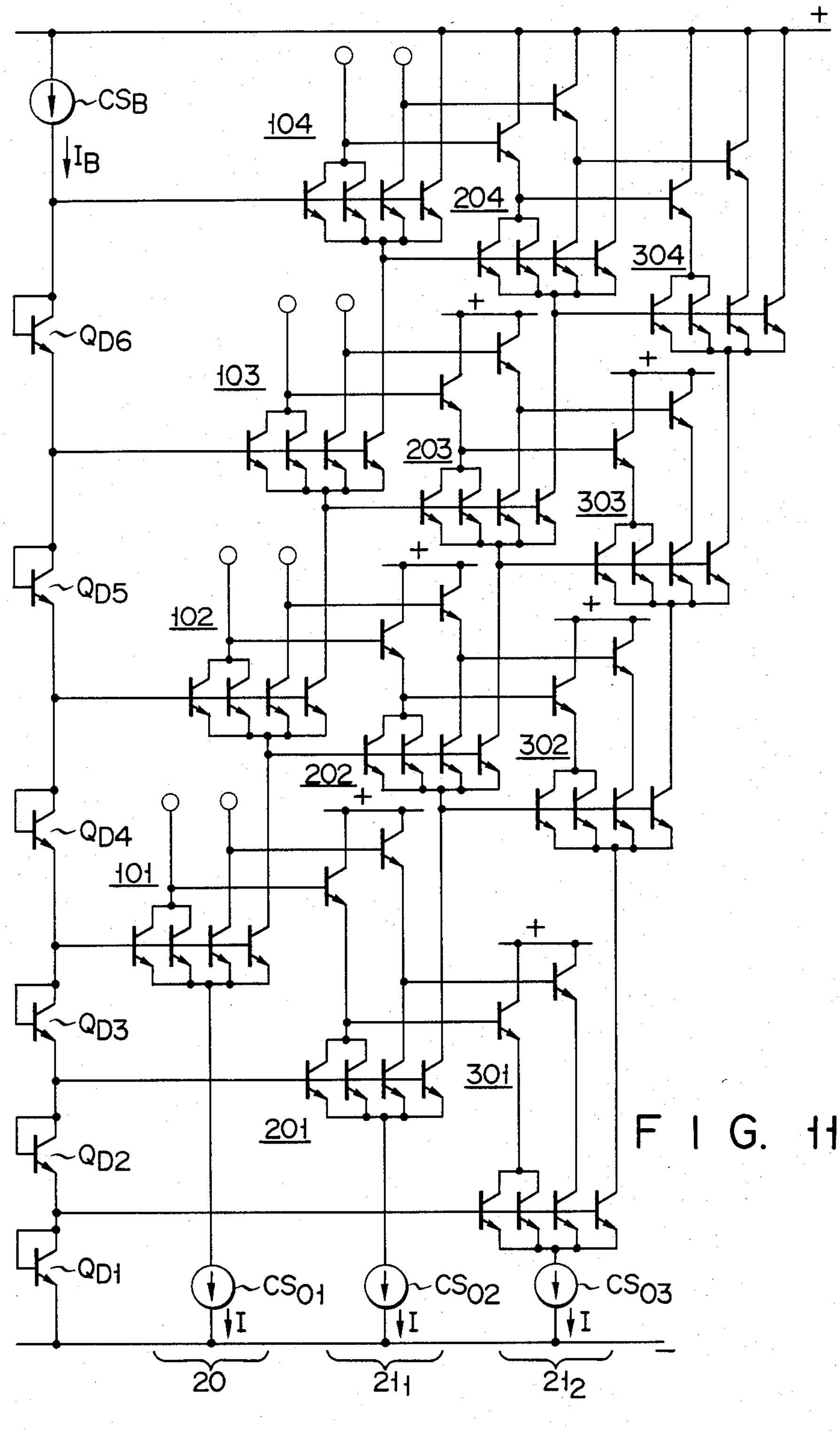

FIG. 11 shows a current source circuit in which the second correction circuit $21_2$ is added to the circuit shown in FIG. 8 so that the secondary or tertiary corrections are possible. The circuit of this embodiment is of the 8-bit configuration instead of the 4-bit configuration. The basic connections of the circuit remain the same as those of the circuits shown in FIGS. 4 and 5. The same reference numerals as in FIGS. 4 and 5 denote the same parts, and a description thereof will be omitted.

Figure 12:
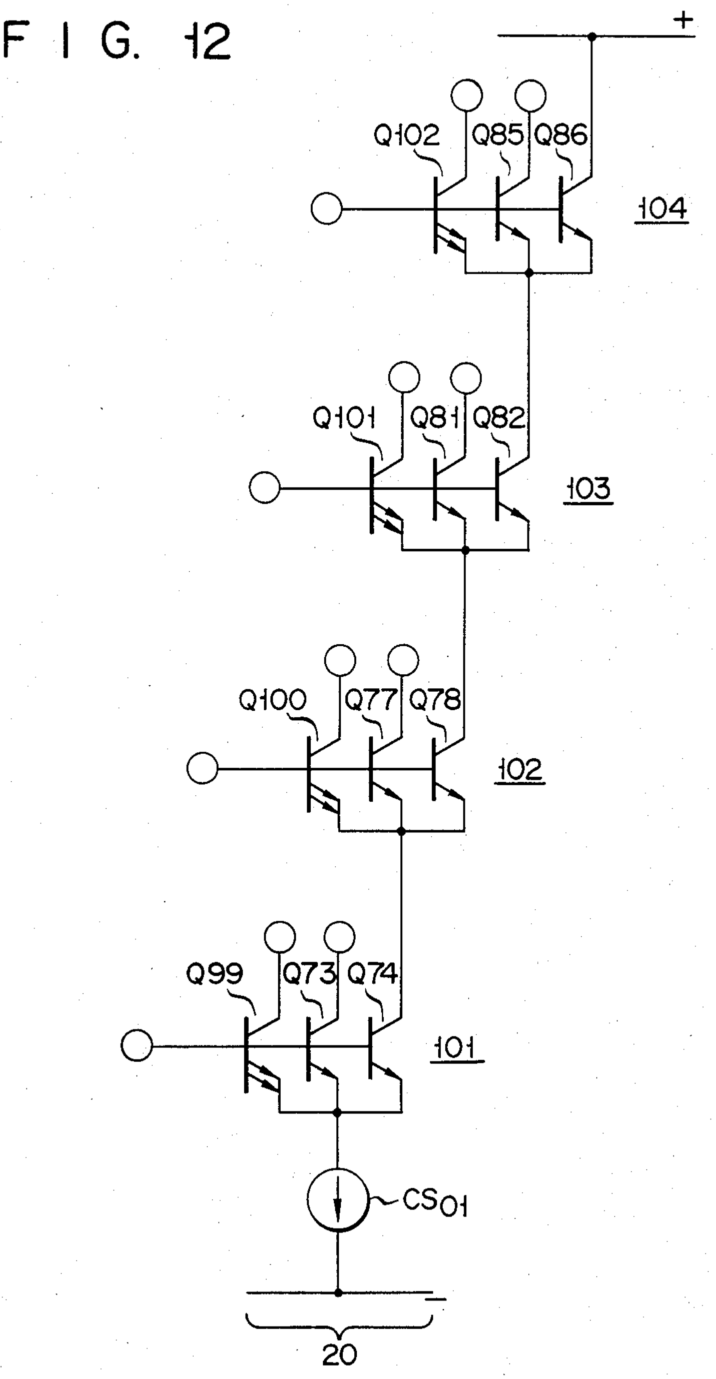

FIG. 12 shows a current source circuit wherein the two parallel-connected transistors in each transistor stage of FIG. 8 is replaced by one multi-emitter transistor.

The parallel-connected transistors Q71 and Q72 in FIG. 8 are replaced by a multi-emitter transistor Q99; the transistors Q75 and Q76 by a multi-emitter transistor Q100; the transistors Q79 and Q80 by a multi-emitter transistor Q101; and the transistors Q83 and Q84 by a multi-emitter transistor Q102. The occupying area of the transistors on the chip may be reduced with the multi-emitter configuration.

Figure 13:
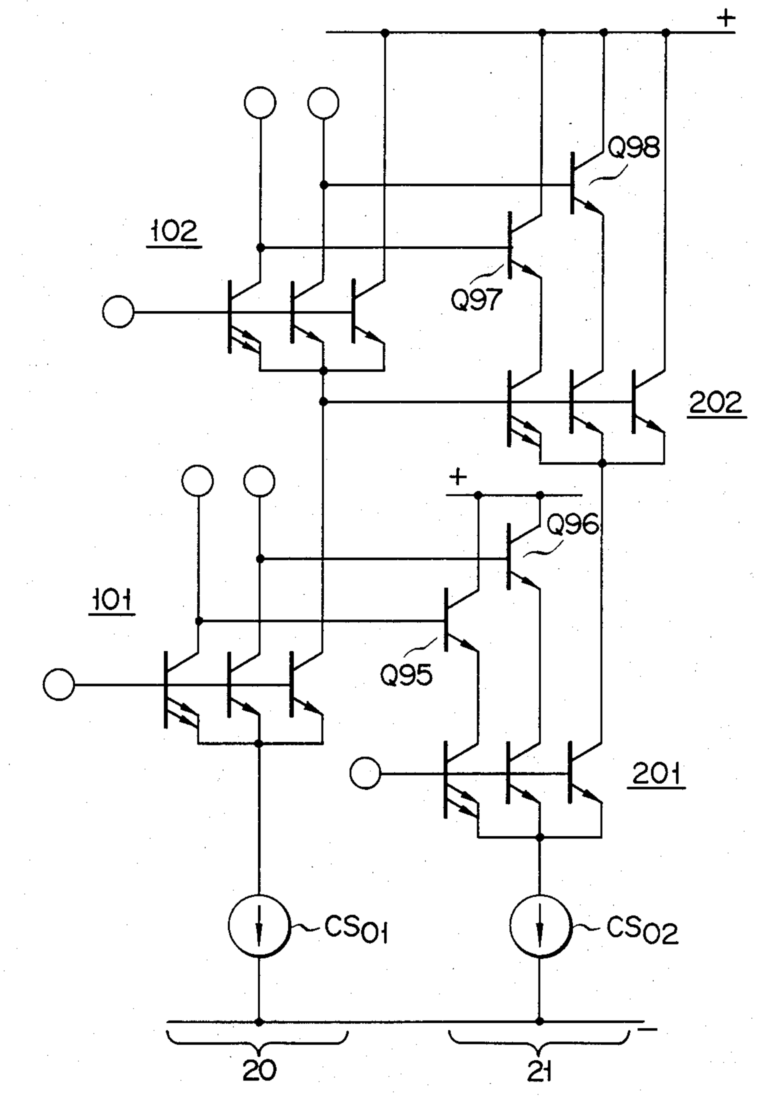

FIG. 13 shows a current source circuit in which the correction circuit 21 for the secondary correction is added to the circuit shown in FIG. 12. For the sake of simplicity, the circuit in FIG. 12 is shown to have the 4-bit configuration in FIG. 13. Since the configuration of the circuit shown in FIG. 13 is basically the same as that shown in FIG. 9, the same reference numerals as in FIG. 9 denote the same parts and a description thereof will be omitted.

Figure 14:
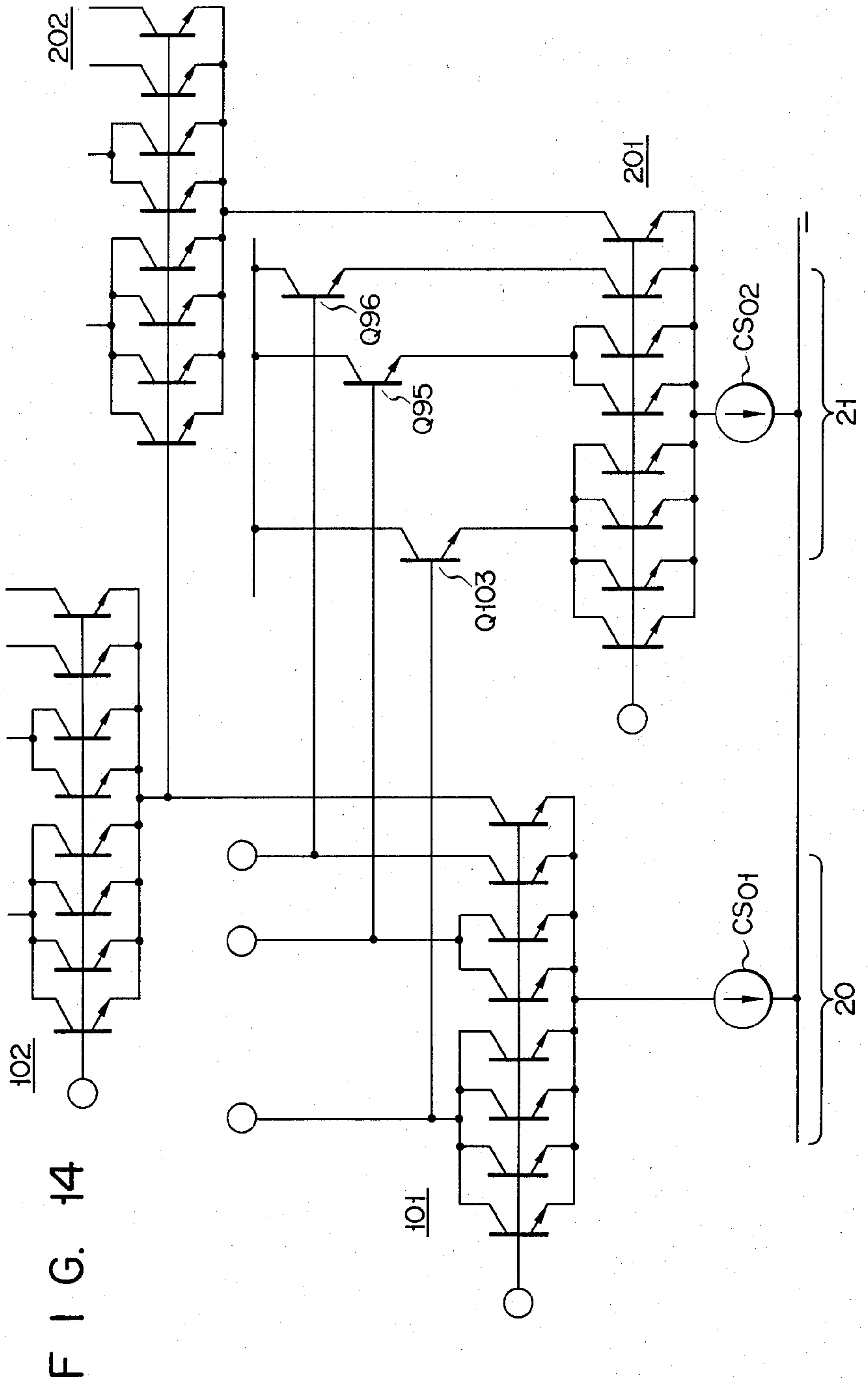

FIG. 14 shows a current source circuit wherein each current division stage comprises eight transistors to divide the input electric current I into eight currents, the output current I/8 is obtained from one of the eight transistors, the collectors of the two other transistors are commonly connected to obtain the output current $I/8\times2=I/4$ from a junction therebetween, and the collectors of the other four transistors are commonly connected to obtain the output current $I/8\times4=I/2$ from a junction therebetween. The current source circuit shown in FIG. 14 further has the correction circuit 21 for performing the secondary correction. Three current division stages are included in place of the two current division stages in the circuit of FIG. 9. For this reason, a correction transistor Q103 is added to the transistors Q95 and Q96 shown in FIG. 9. Since the remaining part of the circuit is basically the same as that of FIG. 9, the same reference numerals as in FIG. 9 denote the same parts, and a description thereof is omitted. Therefore, in this embodiment, the number of output current stages may be decreased, the errors are reduced to the minimum, and the range of input voltage may also be made narrower.

Figure 15:
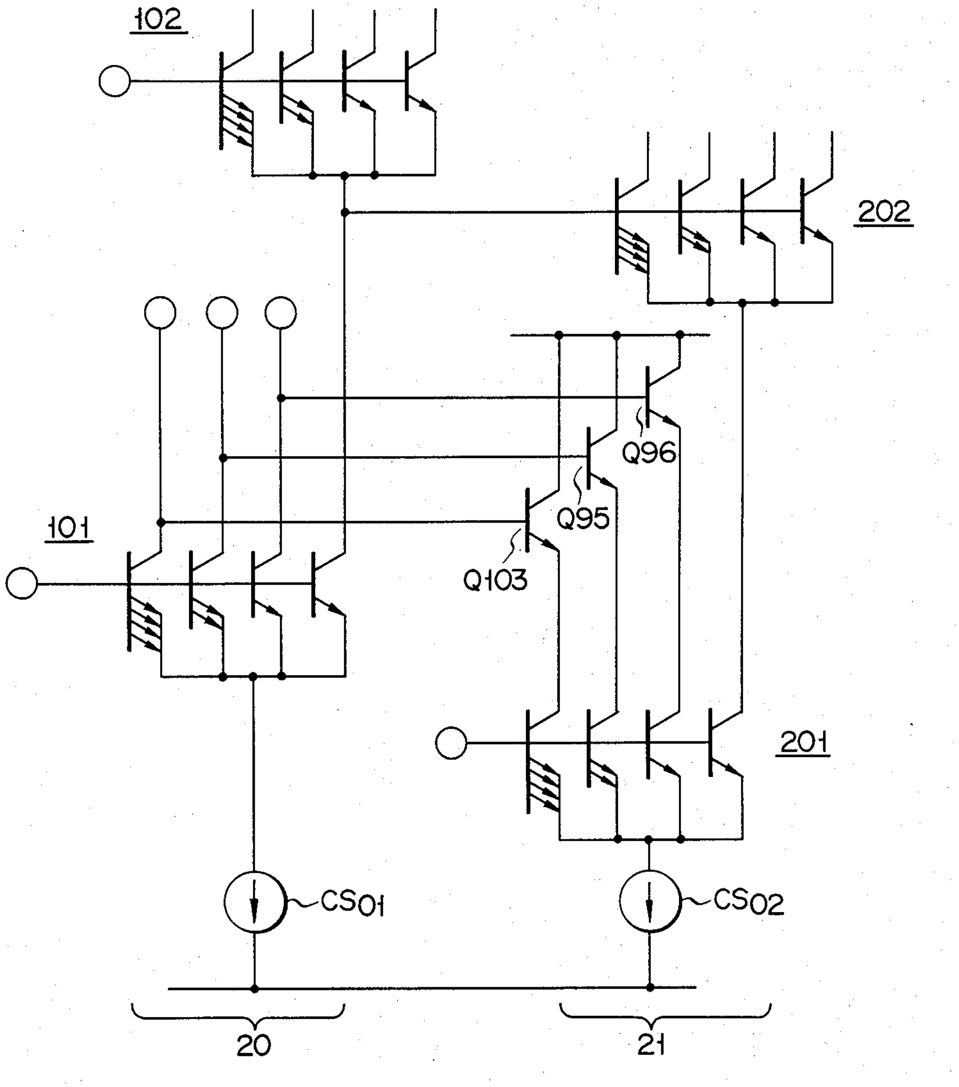

FIG. 15 shows a current source circuit wherein two parallel-connected transistors and four parallel-connected transistors in FIG. 14 are replaced by multi-emitter transistors. The same reference numerals as in FIG. 14 denote the same parts, and a description thereof will be omitted.

Figure 16:
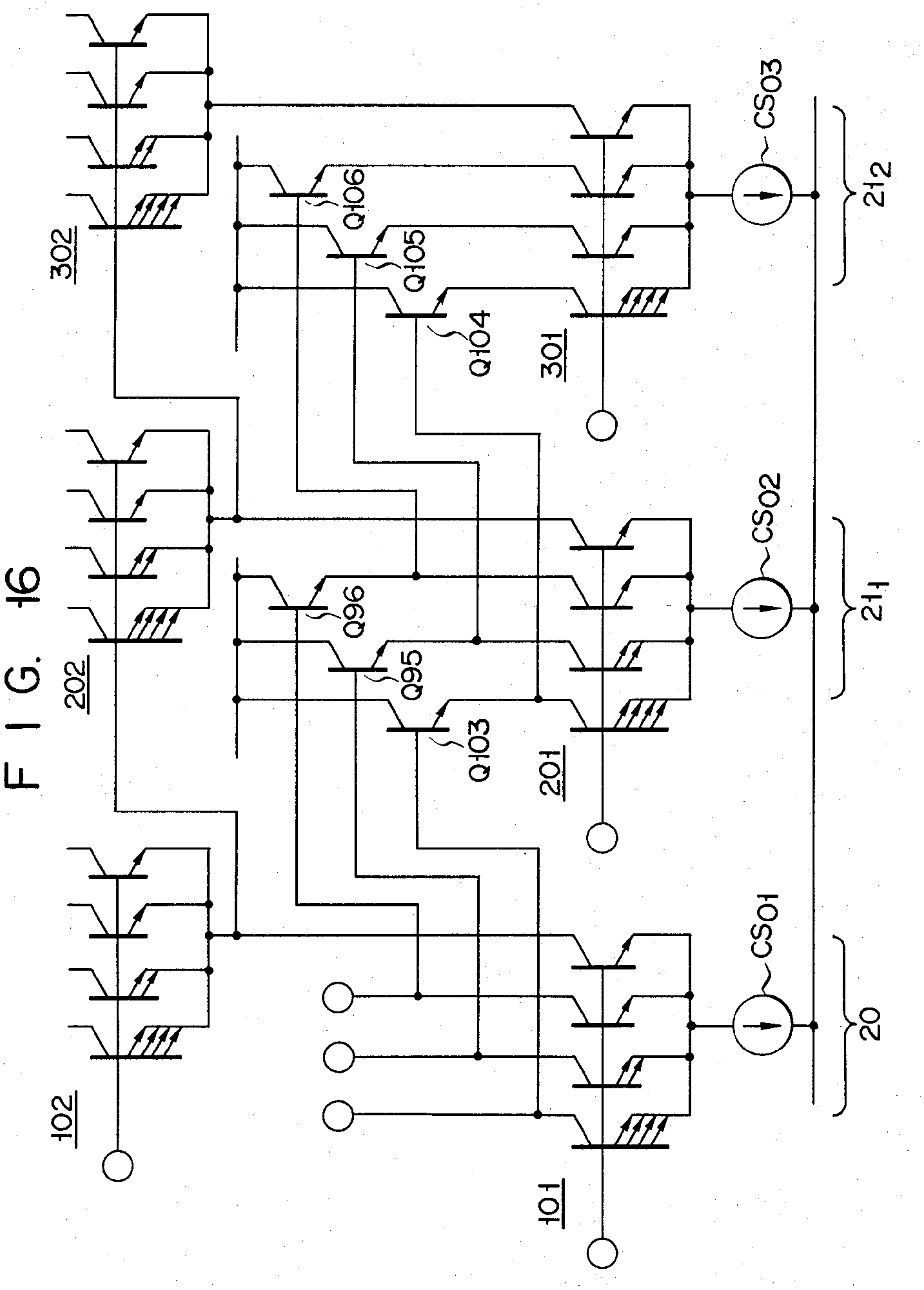

FIG. 16 shows a current source circuit wherein the second correction circuit $21_2$ is added to the circuit shown in FIG. 15. Transistors Q104, Q105 and Q106 are correction transistors. The same reference numerals for the tertiary correction circuit $21_2$ in FIG. 4 denote the same parts as those for the correction circuit $21_2$ in FIG. 16.

In summary, by incorporating a correction circuit for correcting the base currents which are lost in the current division stages for dividing the input electric current, a current source circuit for producing a plurality of weighted output currents is provided wherein the errors due to the base currents in the respective current division stages are reduced to the minimum.

The present invention is not limited to particular embodiments described above. Therefore, various other changes and modifications may be made within the spirit and scope of the present invention.

What is claimed is:

1. A current source circuit comprising:

A current division circuit and a correction circuit, said current division circuit comprising at least one current source and a plurality of current division stages, each stage including a current shunting transistor, said at least one current source and plurality of current shunting transistors of the current division stages being series-connected between a first voltage power source and a second voltage power source, each of said plurality of current division stages further comprising at least one current output transistor, the emitters of said current shunting transistor and said at least one current output transistor of each of said current division stages being commonly connected, the bases of said current shunting transistor and said at least one current output transistor of each of said current division stages being commonly connected and supplied with a predetermined voltage, and an output current being obtained from a collector of said at least one current output transistor of each of said current division stages; and said correction circuit comprising a plurality of correction stages provided in correspondence to said current division stages, each of said correction stages including current sources, one end of each of which is connected to said first voltage power source and outputs a current equal to an output current from the corresponding one of said current division stages, the number of said latter current sources being the same as said transistors of each of said current division stages, and correction transistors, the emitter-collector paths of which are respectively connected between the other end of an individual one of said current sources and said second voltage power source and the bases of which are connected to individual ones of said collectors of said current output and current shunting transistors of a corresponding one of said current division stages and the number of said correction transistors being the same as said transistors of each of said corresponding current division stages.

2. A current source circuit according to claim 1, wherein the configuration of all of said current sources of all of said correction stages of said correction circuit is substantially the same as the configuration of said current sources of said current division circuit.

3. A current source circuit according to claim 2, wherein each of said correction stages of said correction circuit includes a transistor circuit of a configuration substantially the same as the configuration of said transistors of each of said current division stages of said current division circuit, and said correction transistors connected between said second voltage power source and collectors of transistors of said transistor circuit, at least one of said transistors of said transistor circuit being connected as said correction transistor to one of the transistors of a next one of said correction stages, bases of said transistors of a first one of said correction stages being supplied with a predetermined base voltage, and the bases of said transistors of remaining ones of said correction stages being connected to common emitters of corresponding ones of said current division stages.

4. A current source circuit according to claim 1, 2 or 3, further including at least one further correction circuit of a configuration substantially the same as the configuration of said correction circuit, correction stages of said further correction circuit being connected to a preceding one of said correction stages in the same manner as said correction stages of said correction circuit are connected to said stages of said current division circuit.

5. A current source circuit according to claim 1, 2 or 3, further including a bias circuit connected between said first voltage power source and said second voltage power source, said bias circuit comprising a diode element for supplying a bias voltage to said correction stages of said correction circuit, diode elements for supplying bias voltages to said current division stages of said current division circuit, and at least one current source.

6. A current source circuit according to claim 5, wherein each of said diode elements comprises a transistor whose base and collector are commonly connected.

7. A current source circuit according to claim 1, 2 or 3, wherein each of said current division stages has a plurality of said current output transistors, the collectors of some of which are selectively commonly connected, and current outputs are obtained from the commonly connected collectors.

8. A current source circuit according to claim 7, wherein collectors of transistors of said correction stages are commonly connected, said collectors of said transistors numbering the same as the commonly connected collectors of said transistors, and bases of said correction transistors connected to said transistors, said bases of which are commonly connected, of said correction stages are connected to the commonly connected collectors of said transistors of said current division stage.

9. A current source circuit according to claim 4, wherein collectors of transistors of said correction stages of said correction circuit are commonly connected, said collectors numbering the same as the commonly connected collectors in said correction stages of said correction circuit, and bases of correction transistors connected to the commonly connected transistors of said correction stages of said correction circuit are connected to the commonly connected collectors of said transistors of said correction stages of said correction circuit.

10. A current source circuit according to claim 1, 2 or 3, wherein each of said current division stages has a plurality of current output transistors, at least one of which is of a multi-emitter type transistor.

11. A current source circuit according to claim 1, 2 or 3, wherein each of said current division stages has a plurality of current output transistors, at least one of which is of a multi-emitter type transistor, corresponding ones of said transistors of said correction stages being of multi-emitter type transistors.

12. A current source circuit according to claim 4, wherein said transistors of said correction circuit corresponding to said multi-emitter type transistors in each of said correction stages of said correction circuit are multi-emitter type transistors.

13. A current source circuit according to claim 4, further including a bias circuit connected between said first voltage power source and said second voltage power source, said bias circuit comprising a diode element for supplying a bias voltage to said correction stages of said correction circuit, diode elements for supplying bias voltage to said current division stages of said current division circuit, and at least one current source.

14. A current source circuit according to claim 13, wherein each of said diode elements comprises a transistor whose base and collector are commonly connected.

* * * * *